United States Patent [19]
Carver

[11] Patent Number: 6,104,248
[45] Date of Patent: Aug. 15, 2000

[54] AUDIO AMPLIFIER WITH TRACKING POWER SUPPLY UTILIZING INDUCTIVE POWER CONVERTERS

[76] Inventor: Robert W. Carver, 330 Avenue A, Snohomish, Wash. 98290

[21] Appl. No.: 09/282,289

[22] Filed: Mar. 31, 1999

Related U.S. Application Data

[60] Provisional application No. 60/105,449, Oct. 23, 1998.

[51] Int. Cl.[7] .................................................... H03F 3/04
[52] U.S. Cl. .............................. 330/297; 330/263; 330/10
[58] Field of Search ............................. 330/10, 127, 263, 330/267, 279, 296, 297; 323/282, 320, 325; 363/21, 86, 89

[56] References Cited

U.S. PATENT DOCUMENTS

| | | | |
|---|---|---|---|
| 4,054,818 | 10/1977 | Risberg | 318/227 |
| 4,054,843 | 10/1977 | Hamada | 330/263 |
| 4,218,660 | 8/1980 | Carver | 330/297 |
| 4,409,559 | 10/1983 | Amada et al. | 330/295 |
| 4,484,150 | 11/1984 | Carver | 330/297 |
| 4,507,619 | 3/1985 | Dijkstra et al. | 330/297 |
| 4,586,002 | 4/1986 | Carver | 330/297 |
| 4,808,946 | 2/1989 | Carver et al. | 330/297 |
| 4,974,114 | 11/1990 | Kammerer | 361/159 |
| 5,396,194 | 3/1995 | Williamson et al. | 330/297 |
| 5,606,289 | 2/1997 | Williamson | 330/297 |
| 5,748,753 | 5/1998 | Carver | 381/96 |
| 5,898,340 | 4/1999 | Chatterjee et al. | 330/297 |
| 5,929,702 | 7/1999 | Myers et al. | 330/10 |

OTHER PUBLICATIONS

Edoardo Botti et al., "A High Efficiency 4X20 W Monolithic Audio Amplifier for Automobile Radios Using a Complementary D–MOS BCD Technology,"*IEEE Journal of Solid–State Circuits*, vol. 31, No. 12, Dec. 1996, pp. 1895–1901.

*Primary Examiner*—Robert Pascal
*Assistant Examiner*—Khanh Van Nguyen
*Attorney, Agent, or Firm*—Christensen O'Connor Johnson & Kindness PLLC

[57] ABSTRACT

Disclosed is an audio amplifier with a tracking power supply that uses inductive power converters to provide positive and negative amplifier operating potentials of a magnitude that exceeds the DC voltage available to power the amplifier. The tracking power supply includes both a positive-going tracking-up converter and a negative-going tracking-up converter. Each of the tracking-up converters include an inductor, a capacitor, a diode, and a pulse-width modulator. The pulse-width modulator of the positive-going tracking-up converter produces signals representative of the positive amplitude of the audio signal being amplified and the pulse-width modulator of the negative-going tracking-up converter produces signals representative of the negative amplitude of the signal being amplified. The pulses-width modulated signals activate switches that cause current flow to increase through the inductors and subsequently cause the inductors to direct current to the capacitors in a manner that charge the capacitors to the proper tracking voltages.

36 Claims, 14 Drawing Sheets

6,104,248

AUDIO AMPLIFIER WITH TRACKING POWER SUPPLY UTILIZING INDUCTIVE POWER CONVERTERS

This application claims benefit of Provisional Application of Ser. No. 60/105,449, filed Oct. 23, 1998.

FIELD OF THE INVENTION

This invention relates generally to audio amplifiers and, more specifically, to audio amplifiers with tracking power supplies.

BACKGROUND OF THE INVENTION

Over the past few years, significant advancements have been made in the field of audio amplifiers. Improvements have been made in areas such as size, weight, energy efficiency, cost, sound quality, and product life. Advancements in the area of energy efficiency have been particularly sought after, since the efficiency of the amplifier significantly impacts other circuit and system characteristics such as size, weight and cost of manufacture.

One development that has significantly improved audio amplifier efficiency and thus provided circuits of reduced weight and size is the use of arrangements in which the amplifier operating potentials (typically referred to as "rail voltages") are provided by a "tracking power supply." That is, the output of the power supply varies in accordance with the audio input signal so that the magnitude of the power supply output voltage exceeds the voltage needed by the amplifier by a predetermined voltage offset. Thus, the instantaneous power provided to the amplifier by the power supply exceeds the amplifier output power by a relatively small amount. As a result, the energy dissipated by the amplifier is minimized which allows both the amplifier and the tracking power supply to be mounted in a small enclosure or packaged as a single printed circuit board.

A general discussion of audio amplifier tracking power supplies is provided in U.S. Pat. No. 5,396,194, to Williamson et al., FIGS. 1A, 1B and 1C of which are included herein as FIGS. 1A, 1B and 1C. These figures illustrate the positive and negative amplifier operating potentials (referred to in Williamson et al. as "source" and "sink" voltages) of three types of tracking power supplies referred to as: (1) envelope trackers; (2) rail-to-ground trackers; and (3) rail-to-rail trackers. In FIGS. 1A–1C, the middle signal depicts the amplifier output signal, the upper signal is the positive power input to the audio amplifier and the lower signal is the negative power input to the audio amplifier.

As illustrated in FIG. 1A, in an envelope tracker the magnitude of both the positive and negative power inputs for the audio amplifier increase and decrease in accordance with the magnitude of the audio output signal. That is, the positive operating potential supplied by an envelope tracker is a positive voltage that is equal to the magnitude of the audio amplifier output signal plus a voltage offset ($V_{OFFSET}$ in FIG. 1A) and the negative operating potential is a negative voltage that is equal to the magnitude of the audio output signal minus a voltage offset. Thus, the maximum differential between the voltages supplied to the positive and negative power inputs occurs when the audio signal is at maximum amplitude, with the difference between the potential supplied to the amplifier positive power input and negative power input being twice the amplitude of the amplifier output signal plus twice the voltage offset.

As illustrated in FIG. 1B, in a rail-to-ground tracker, the positive power input for the audio amplifier tracks the positive portions of the audio signal and the negative power input for the audio amplifier tracks the negative portions of the audio signal. The resulting difference between the positive and negative power inputs at any point in time is thus equal to the instantaneous output of audio amplifier plus two times the voltage offset.

As illustrated in FIG. 1C, a rail-to-rail tracker supplies the positive and negative power inputs to the audio amplifier so that the positive and negative supply voltages both track the audio output signal. That is, the positive supply voltage is equal to the amplifier output voltage plus a voltage offset and the negative supply voltage is equal to the amplifier output voltage minus a voltage offset. Thus, the differential between the two supply voltages is substantially equal to two times the voltage offset for all values of an audio input signal.

With respect to efficiency, envelope trackers are generally less efficient than rail-to-ground and rail-to-rail trackers with rail-to-rail trackers generally being the most efficient. However, as noted in the Williamson et al. patent, rail-to-rail trackers are not commercially available, thus making the rail-to-ground trackers generally the most efficient type of tracking power supply on the market.

An exemplary envelope tracker is illustrated in U.S. Pat. No. 4,218,660 to Robert W. Carver, FIGS. 1, 2 and 4 of which are included herein as FIGS. 2, 3A, and 3B, respectively.

As illustrated in FIG. 2, the arrangement of U.S. Pat. No. 4,218,660 includes a speaker 10, which is driven by an amplifier 12 having two signal input terminals 20 and 22. The power supply circuitry in FIG. 2 includes a transformer 14 and a switch 26 that controls the flow of current through the primary winding of the transformer 14. Switch 26 is controlled by a ramp time modulator 40. The ramp time modulator 40 receives a periodic triangular waveform from a square wave to triangular wave converter 38, which converts a constant series of pulses from a pulse generator 36. Ramp time modulator 40 also receives an input from a comparator 32, which compares a feedback signal from the amplifier 12 to a signal derived from the audio signal being amplified. A power output feedback circuit 34 provides the feedback signal to one input terminal of the comparator 32, while an absolute value detector 28 and a non-linear peak detector 30 provide a signal representative of the audio signal to the second input terminal of the comparator 32.

FIGS. 3A–3I illustrate typical signals for the circuitry of FIG. 2. FIG. 3A depicts a typical audio signal that is supplied both to the amplifier input terminals 20 and 22 of the amplifier 12, and to the absolute value detector 28. In FIG. 3B, the audio signal is shown as it appears at the output of the absolute value detector 28. The output of the non-linear peak detector 30 is illustrated as the solid line in FIG. 3C and can be seen to track the audio signal of FIG. 3B. The signal from the non-linear peak detector 30 is compared with a signal from the power output feedback 34 (the dotted line in FIG. 3D) by the comparator 32 to determine the required operating potential for the amplifier 12. The solid line in FIG. 3E represents the output of the comparator 32 and illustrates the manner in which the power supply circuitry in effect "tracks" the audio input signal and maintains the power inputs above required levels by a predetermined amount. In practice, the quiescent voltage drop across each of the transistors 16 and 20 is typically on the order of approximately 5 volts.

FIG. 3F depicts the output of pulse generator 36 which functions to generate a rectangular pulse signal at a predetermined pulse frequency and constant voltage. This signal essentially serves as a clock signal that is supplied to the square wave to triangular wave converter 38. As illustrated by the solid line of FIG. 3G, square wave to triangular wave converter 38 converts the signal shown in FIG. 3F to a periodic triangular signal in which the magnitude of the time rate of change for positive and negative-going portions of the signal is substantially identical.

The output of the square wave to triangular wave converter 38 is coupled to the ramp time modulator 40, which also receives the control signal from the comparator 32. Shown in FIG. 3G is a portion of the control signal from the comparator 32 (illustrated in broken lines) superimposed with the triangular waveform supplied by the converter 38. In effect, the interception of the control signal supplied by the comparator 32 with the triangular wave supplied by square wave to triangular wave converter 38 define switching points that cause the ramp time modulator 40 to produce a pulse-width modulated signal of the type shown in FIG. 3H. As can be seen in FIG. 3H, the pulse frequency of the pulse-width modulated signal is the same as the signal supplied by the pulse generator 36 and the duration of each pulse is determined by the interception of the control signal from comparator 32 with the triangular wave supplied by converter 38. Specifically, the width of each pulse is equal to the time that elapses between intercept points on adjacent negative and positive slopes of the triangular wave.

In the circuit of FIG. 2, the pulse-width modulated signal of FIG. 3H activates the switch 26 to cause current pulses in the primary winding 14a of the transformer 14 such as those illustrated in FIG. 3I. In that regard, it can be seen that a pulse of relatively short duration (e.g., the pulse indicated by reference numeral 42 in FIG. 3H) produces a corresponding transformer current pulse 44 of relatively a small magnitude, since a relatively short time period is available for the current to build or "ramp up". As the voltage pulses of FIG. 3H increase in duration, the magnitude of the current pulses in the transformer primary winding 14a increase correspondingly, with pulse 46 (the longest duration in FIG. 3H) producing a current pulse 48 of the largest magnitude of those shown in FIG. 3I. Rectification and filtering on the secondary side of transformer 14 provides the output transistors with positive and negative operating potentials that track the audio input signal.

More specifically, in the arrangement of FIG. 2, transistors 16 and 18 are connected in a conventional push-pull configuration in which the collector of transistor 16 is connected for receiving a positive operating potential and the collector of transistor 18 is connected for receiving a negative operating potential. Connected to the collectors of transistors 16 and 18 are half wave rectifier circuits that receive a stepped-up input signal of the type shown in FIG. 3I. Because the signals supplied to the half wave rectifier circuits are provided by a grounded center tap secondary winding of transformer 14 and because of the manner in which the rectifier diodes are poled, positive operating potential is supplied to the collector of transistor 16 and negative operating potential is supplied to the collector of transistor 18. Moreover, since the energy in each pulse of current in the primary winding of transformer 14 is representative of the amplitude of the applied audio signal, the positive and negative operating potentials supplied to transistors 16 and 18 substantially track the audio input signal with the magnitude of the operating potentials being primarily determined by the turns ratio of transformer 14.

Another type of tracking power supply is illustrated in U.S. Pat. No. 4,484,150, to Carver in which the voltage levels provided to the power inputs of the audio amplifier increase and decrease in discrete steps in accordance with the amplitude of the audio input signal and, hence, the amplitude of the audio output signal. In one embodiment, a 12-step system is used to approximate the shape of the audio input signal. U.S. Pat. No. 5,748,753, to Carver discloses another type of tracking power supply that is powered by conventional AC power (e.g., 115 volts, 60 Hertz). In the arrangement of U.S. Pat. No. 5,748,753, the AC power signal is stepped down, rectified and controlled to provide operating potentials that track the audio input.

Rail-to-ground tracking power supplies are disclosed in U.S. Pat. No. 4,054,843 to Hamada, U.S. Pat. No. 4,409,559 to Amada, and U.S. Pat. No. 4,507,619 to Dijkstra. The Dijkstra patent discloses an exemplary rail-to-ground tracking power supply that will be discussed in more detail below. The sole figure of the patent to Dijkstra is included herein as FIG. 4.

As illustrated in FIG. 4, the signal from a signal source 101 is supplied to the noninverting input of a control amplifier 102; the power supply terminals of which are connected to a terminal 103 for receiving a positive operating potential and a terminal 104 for receiving a negative operating potential. The complementary outputs 102-1 and 102-2 of the control amplifier 102 provide input signals to transistor output stages 105 and 106, which are of a conventional configuration. A loudspeaker 107 is connected between the output of transistor output stages 105 and 106 and circuit common (ground).

As is typical with rail-to-ground power supplies, separate circuits are used to provide the positive and negative operating potential for the control amplifier 102. In the arrangement shown in FIG. 4, the audio input signal is amplified by an amplifier 109. Positive portions of the signal supplied by the amplifier 109 are coupled through a diode 112 and provided to a series of components 116, 119, 120, 121, 122, and 123, which provide the positive supply voltage for the output stage 105. The negative portion of the output signal of the amplifier 109 is coupled through a diode 113 and processed by the circuit shown in the lower portion of FIG. 4, the components of which correspond on a one-to-one basis with the circuit shown in the upper portion of FIG. 4. Although arrangement of FIG. 4 provides the positive and negative operating potentials required by the depicted transistor output stages 105 and 106, it should be noted that the magnitude of the supplied positive and negative voltages cannot exceed the positive and negative operating potentials of amplifiers 102, 109, and 116 (i.e., the positive and negative voltages supplied to terminals 103 and 104 in FIG. 4). Thus, the arrangement disclosed by the Dijkstra patent is not directly suitable for use in automotive sound systems and other arrangements in which the voltage provided by a battery or other power source is less than the peak-to-peak voltage of the audio output signal required for the desired maximum output power.

Prior art rail-to-ground tracker arrangements such as those disclosed in the previously mentioned Hamada and Amada patents provide amplifier operating potentials that track the audio input and are capable of providing operating potentials that exceed the operating potential supplied to the tracker arrangement. However, transformers are used to obtain the increased operating potentials, thus adding substantial weight, size and cost to the overall arrangement. Moreover, such arrangements require relatively complex circuit arrangements to control and process the signal supplied to and provided by the transformer. Largely because of size, weight and cost, tracking power supplies (and, in particular rail-to-ground trackers) have not been incorporated in automotive sound systems or other applications that are powered by a battery or other relatively low voltage supply.

SUMMARY OF THE INVENTION

In the broadest sense, the invention is a tracking power supply that tracks an applied audio signal to regulate the power inputs of an audio amplifier so that amplifier dissipation losses are reduced. By tracking the power requirements of the audio amplifier such that high power supply levels are only provided when needed, the audio amplifier is able to produce high-quality sound at high power levels.

In accordance with one aspect of the invention, the power supply for the audio amplifier in effect steps up the voltage from a battery or other DC power source without requiring the use of a transformer. The voltage step-up is accomplished in the circuit using an inductive power conversion technique that eliminates the need for one or more transformers, thus providing a significant reduction in the size, weight, and cost of the power supply.

In accordance with another aspect of the invention, the power supply eliminates much of the complex control circuitry required to drive a transformer in a traditional tracking power supply. The resulting simpler circuitry occupies a much smaller volume than prior art arrangements, with a prototype embodiment of the invention being realized as a unit having dimensions of 3-inch by 5-inch by 1⅛-inch.

In accordance with still another aspect of the invention, the tracking power supply is a rail-to-ground type tracker which includes both what is referred to herein as a positive-going tracking-up converter and a negative-going tracking-up converter. The negative-going tracking-up converter is particularly advantageous because it converts a positive battery or other DC voltage source into a large negative voltage supply that can be used for the negative power input of an audio amplifier.

It will be appreciated that the disclosed tracking power supply is particularly advantageous for use in an automobile sound system. The low thermal dissipation achieved by the invention is of particular importance in an automobile sound system which, by necessity, must be compact and often is mounted where little or no convection cooling is available. In addition, the invention lacks circuit complexity and requires no transformer, thus allowing the invention to be realized as a very compact auxiliary unit or easily incorporated in the housing of a conventional sound system. In addition, the high-power output of an amplifier system configured in accordance with this invention provides high-quality sound reproduction at an output level previously unavailable with such a compact system. More specifically, a prototype of the present invention that is powered by an automobile battery produces as much as 500 watts of output power when loaded with a 4 ohm high-back EMF loudspeaker and approximately 240 watts when loaded with a 4 ohm resistive load.

BRIEF DESCRIPTION OF THE DRAWINGS

The foregoing aspects and many of the attendant advantages of this invention will become more readily appreciated as the same becomes better understood by reference to the following detailed description, when taken in conjunction with the accompanying drawings, wherein.

DETAILED DESCRIPTION OF THE PREFERRED EMBODIMENT

Figure 5:
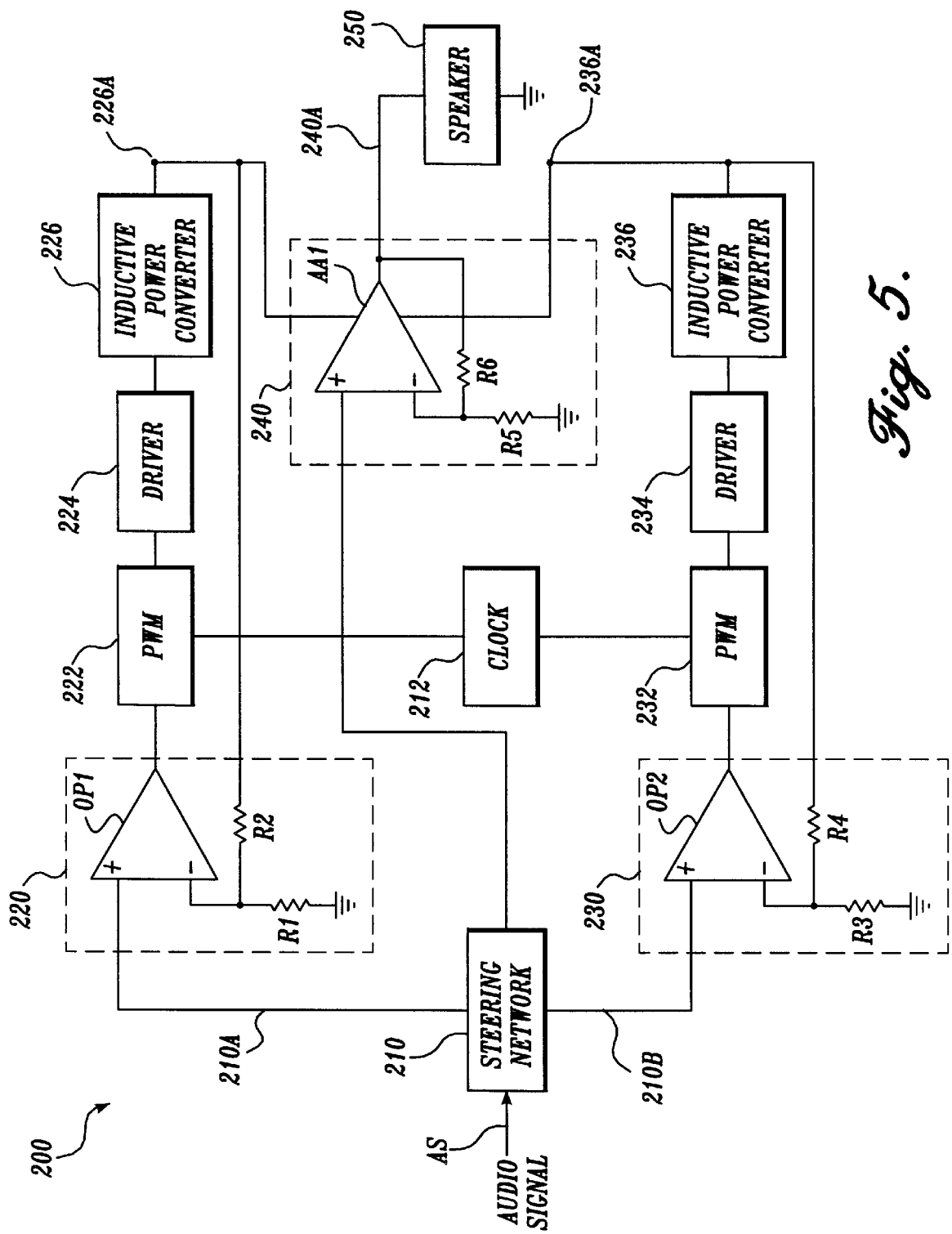
FIG. 5 is a block diagram of an audio amplifier that includes a rail-to-ground tracking power supply according to the present invention.

Shown in FIG. 5 is a tracking power supply 200, constructed in accordance with the present invention to provide the positive and negative power inputs (operating potentials) for an audio amplifier AA1. A basic feature of the tracking power supply 200 is the use of inductive power converters 226 and 236 to increase the voltage supplied by a battery or other power source (not shown in FIG. 5) to the voltage levels required by the amplifier AA1. The use of the inductive power converters 226 and 236 allows the tracking power supply 200 to operate in environments such as automobile sound systems without the need for a transformer.

As illustrated in FIG. 5, the audio signal being amplified (AS in FIG. 5) is coupled to a steering network 210 and the noninverting input of the audio amplifier AA1. The steering network 210 divides the audio signal AS into a positive signal 210a and a negative signal 210b.

Positive signal 210a is connected to the noninverting input of an operational amplifier OP1 of an input reference amplifier 220. Included in the input reference amplifier 220 is a pair of resistors R1 and R2, which establish the gain of operational amplifier OP1 by providing feedback from the output of inductive power converter 226 to the inverting input terminal of amplifier OP1. Specifically, the resistor R1 is coupled between the inverting input of operational amplifier OP1 and ground, and the resistor R2 is coupled between the inverting input of operational amplifier OP1 and the output of the inductive power converter 226. Input reference amplifier 220 amplifies the positive audio signal 210a and supplies the amplified signal to a pulse-width modulator 222.

Figure 2:
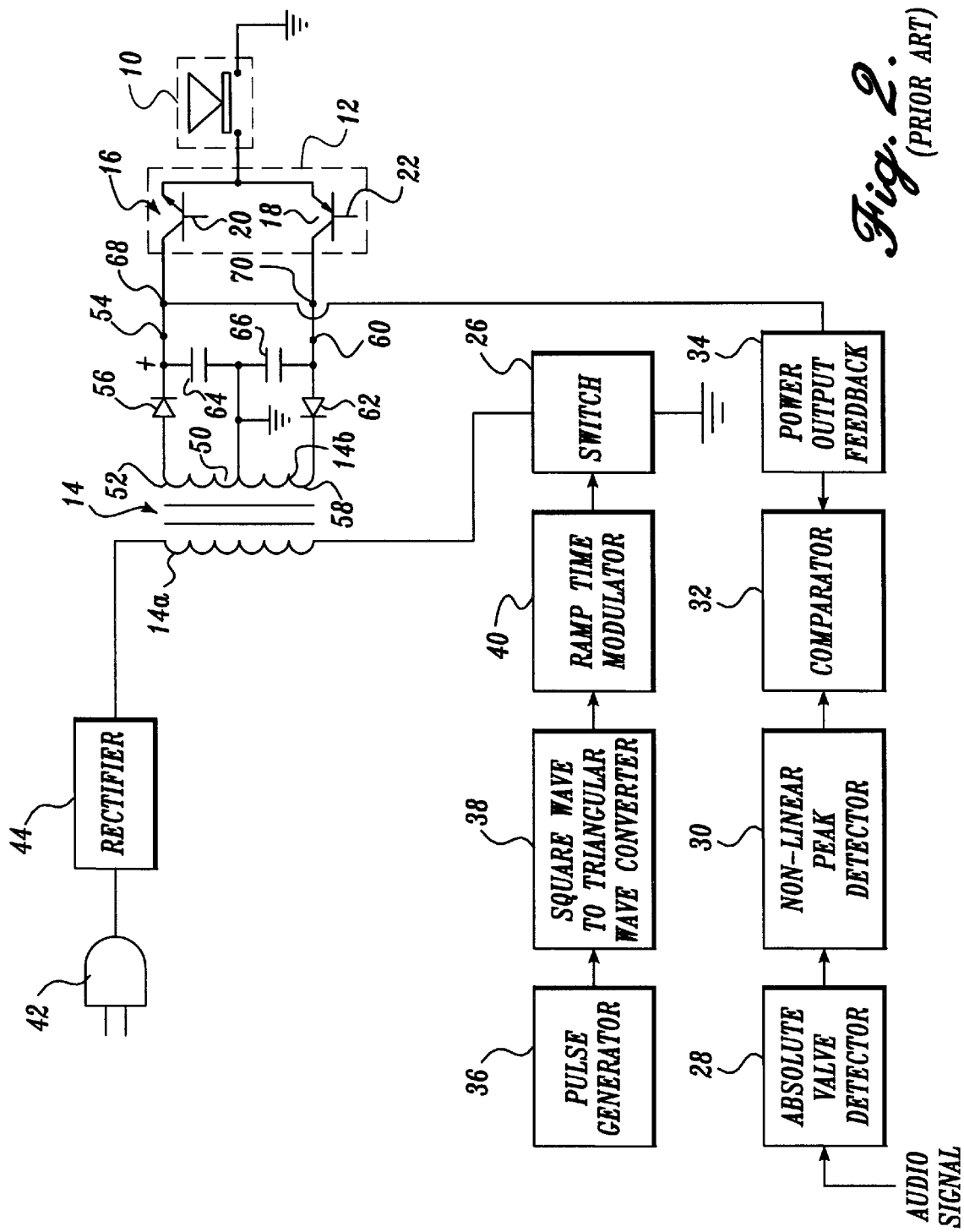
FIG. 2 is a schematic diagram of a prior art audio amplifier that incorporates an envelope type tracking power supply.
Figure 3A:
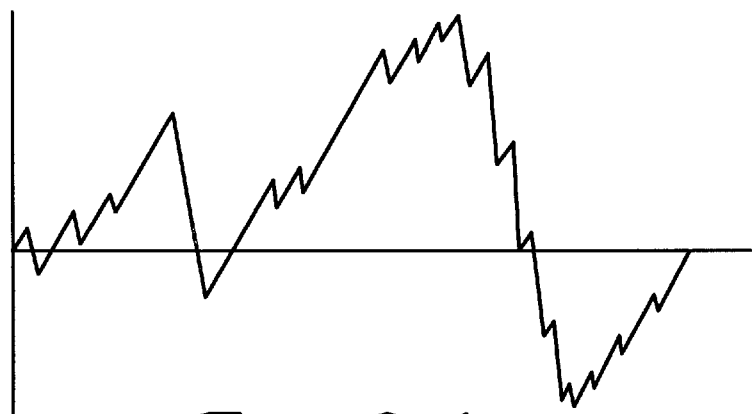
FIGS. 3A–3I are signal diagrams illustrating the operation of the prior art circuit of FIG. 2.
Figure 3B:
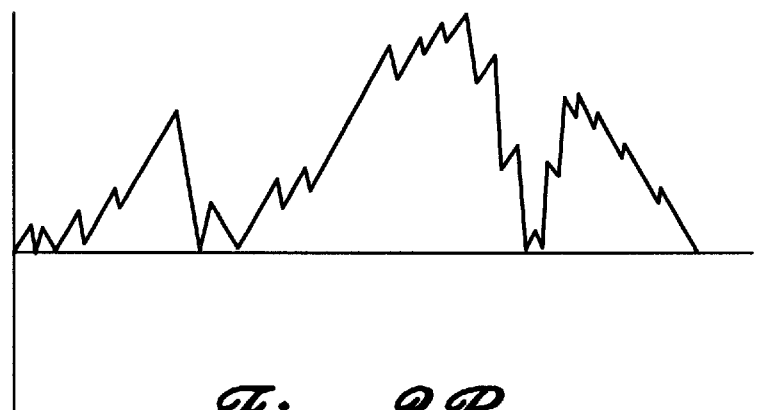
Figure 3C:
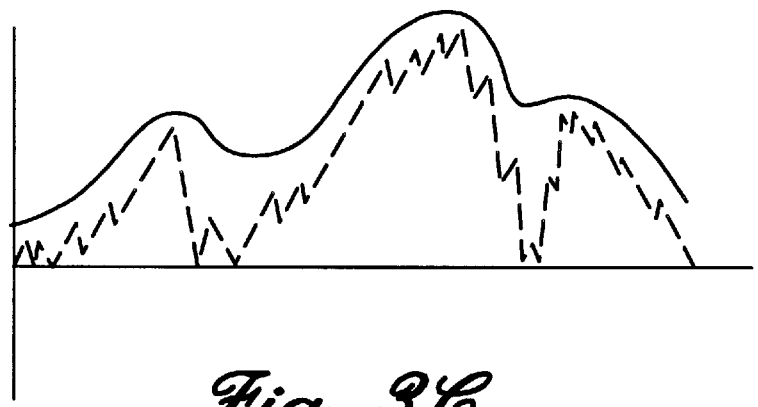
Figure 3D:
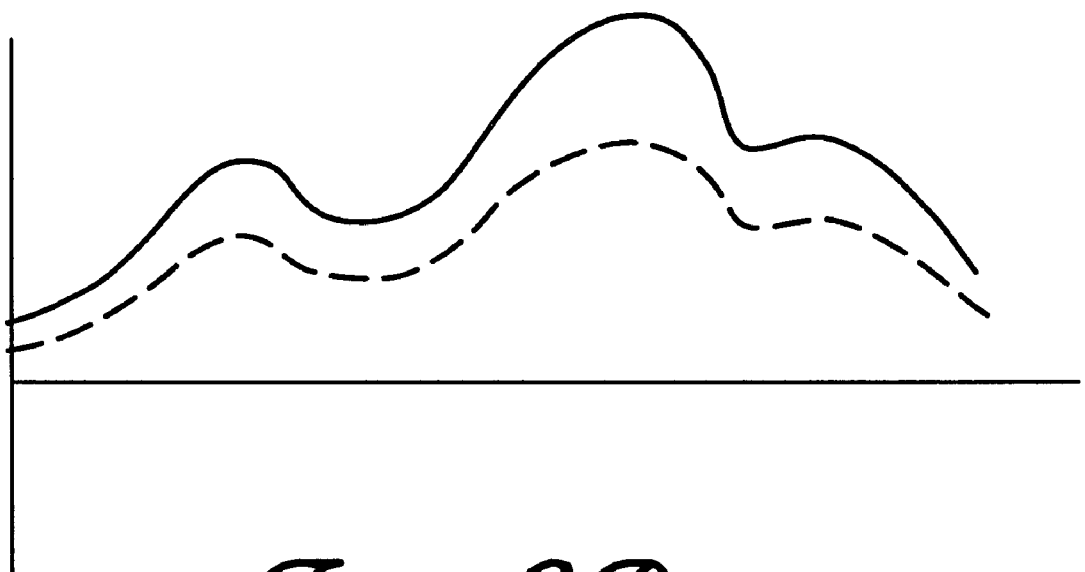
Figure 3E:
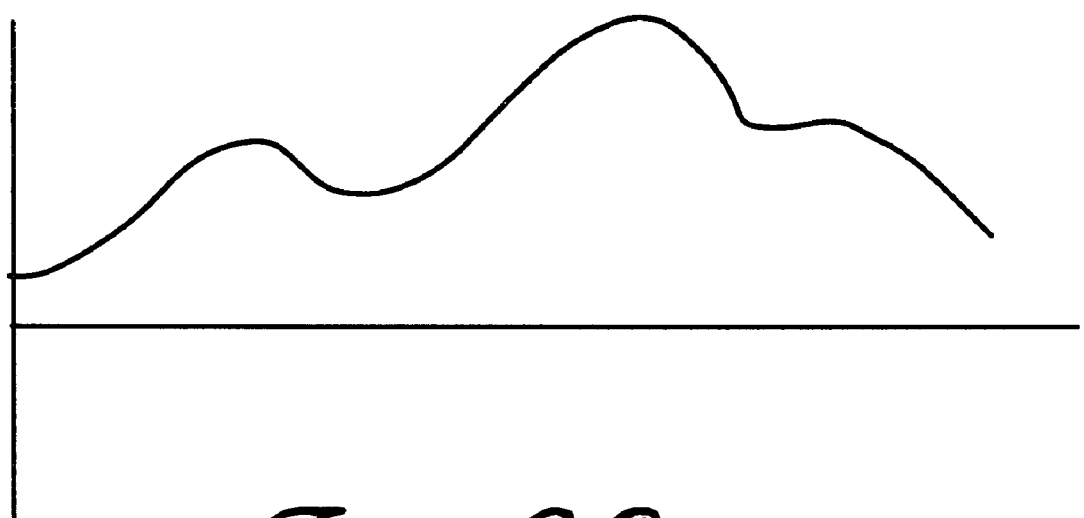
Figure 3F:
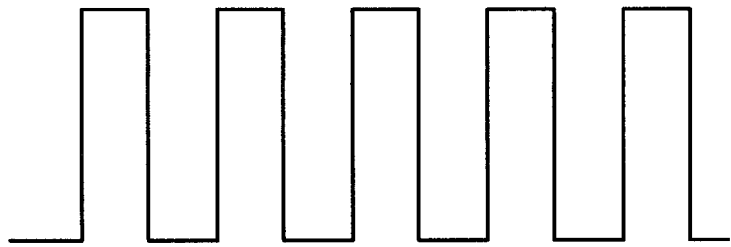
Figure 3G:
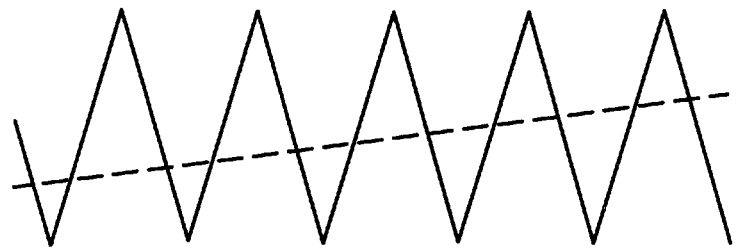
Figure 3H:
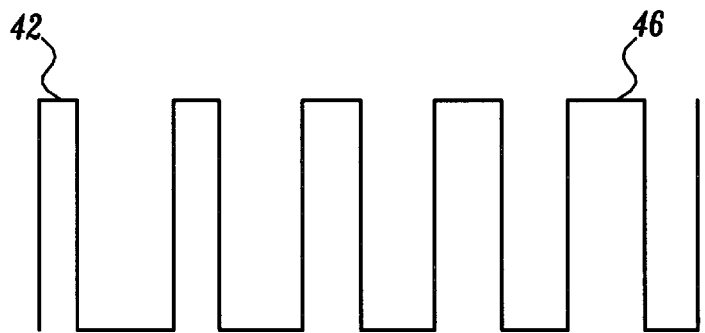
Figure 3I:
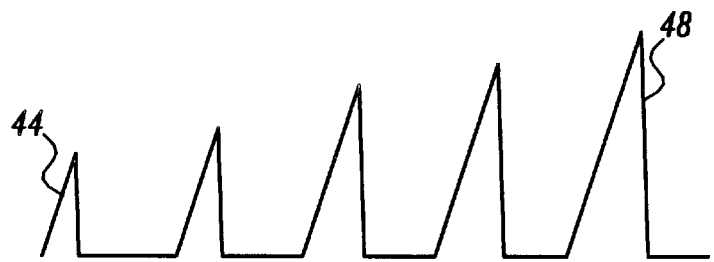
Figure 4:
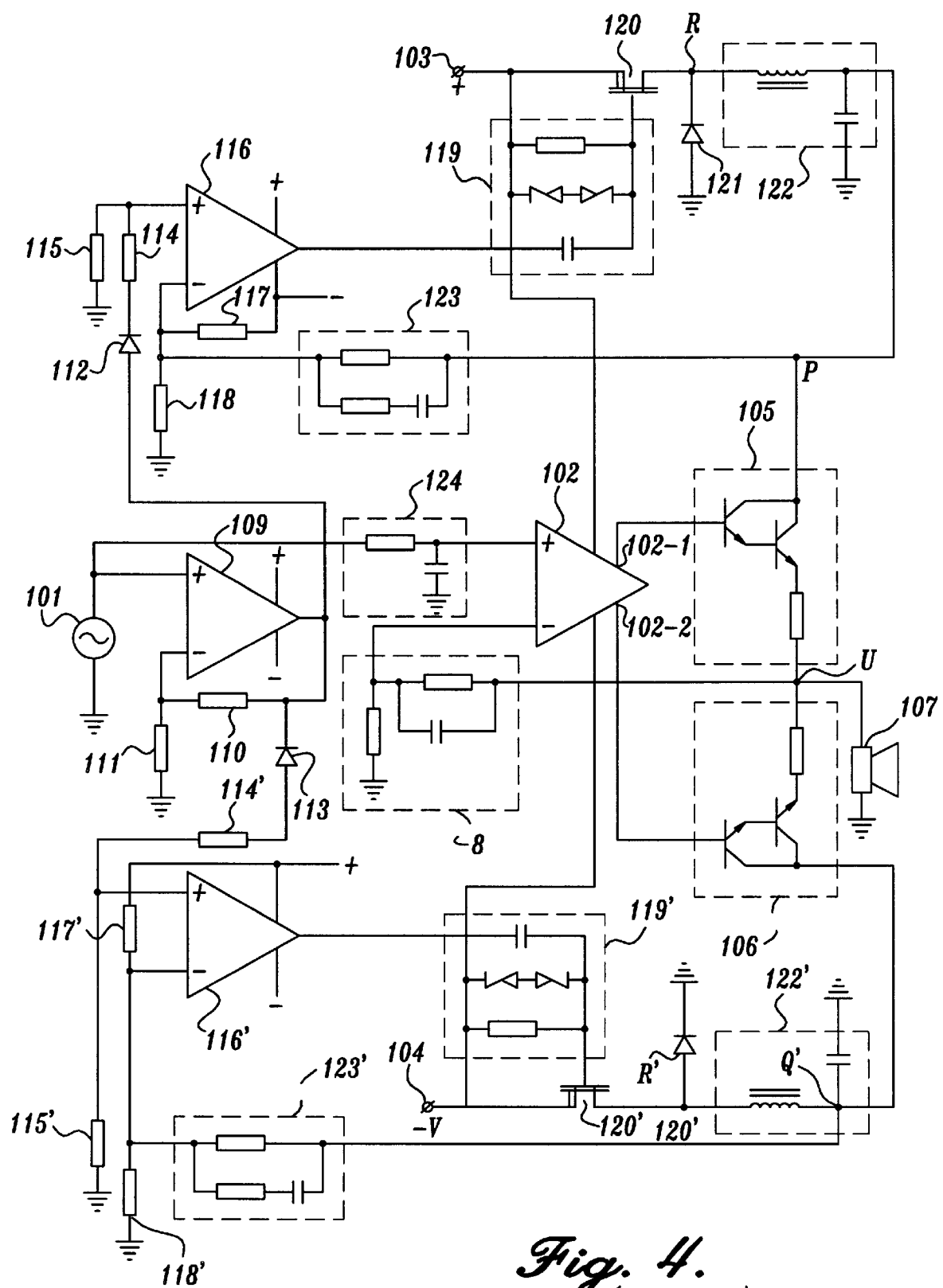
FIG. 4 is a schematic diagram of a prior art audio amplifier that incorporates a rail-to-ground type tracking power supply.

A clock signal provided by a clock circuit 212 sets the pulse repetition rate (frequency) of the pulse-width modulator 222. The pulse-width modulated signal generated by the pulse-width modulator 222 is provided to a driver circuit 224, the output terminal of which is connected to the input of the inductive power converter 226. The pulse-width modulator 222 and the driver 224 operate in conjunction with one another to provide a pulse-width modulated signal that is representative of amplitude of positive signal 210a and is capable of driving the inductive power converter 226. That is, like the output provided by the prior art ramp time modulator 40 of FIG. 2, the output of driver 224 is a pulse-width modulated signal having a duty cycle that is proportional to the amplitude of the audio input signal and, thus, is representative of the operating power required by the audio amplifier (240 in FIG. 5). In a currently preferred embodiment of the invention that serves as a subwoofer amplifier, the pulse-width modulator 222, (and, hence, the driver 224) operate at a pulse frequency of approximately 130 kilohertz.

As was previously mentioned, and as will be described in more detail, the inductive power converter 226 provides positive operating potential to the positive power input of audio amplifier AA1, which can exceed the voltage supplied by the battery or other DC power source (not shown in FIG. 5) that provides operating potential for the arrangement shown in FIG. 5. That is, the output signal that is provided by inductive power converter 226 is in effect stepped up from the voltage supplied by a battery or other power source and tracks the positive-going portions of the audio input signal AS over a significant range of input signals to provide a positive amplifier operating potential that slightly exceeds the potential required by the audio amplifier AA1. Thus, for ease of description, the combination of input reference amplifier 220, pulse-width modulator 222 and inductive power converter 226 is generally referred to herein as positive-going, tracking-up converter.

Referring still to FIG. 5, the negative signal 210b, provided by the steering network 210, is supplied to a cascade-connected combination of an input reference amplifier 230, a pulse-width modulator 232, a driver circuit 234, and an inductive power converter 236, which process the negative signal 210b in a manner similar to the processing of the positive signal 210a by the positive-going tracking-up converter of FIG. 5. Thus, the output signal 236a that is supplied by inductive power converter 236 and coupled to the negative power input of amplifier AA1 is a negative voltage that essentially tracks negative signal 210b and that slightly exceeds the operating potential required by the audio amplifier AA1. Like the signal provided by inductive power converter 226, the maximum voltage level of signal 236a can exceed the voltage of the system battery or other DC power supply. For ease of description, because the components 230, 232, 234, and 236 are capable of supplying a negative voltage that is stepped-up in magnitude from the positive voltage supplied by a battery or other power source, and because the stepped-up voltage tracks the negative portions of the audio input signal AS, the combination of components is generally referred to herein as a negative-going, tracking-up converter.

As described above, the output of inductive power converter 226 is provided as the positive power input for the audio amplifier AA1, and the output of inductive power converter 236 is provided as the negative power input for the audio amplifier AA1. In the arrangement of FIG. 5, the audio amplifier AA1 is included within a dashed outline that is identified as audio amplifier circuitry 240. Also included in audio amplifier circuitry 240 are resistors R5 and R6, which are connected to provide feedback, with R5 being connected between the inverting input of audio amplifier AA1 and ground, and resistor R6 being connected between the output of audio amplifier AA1 and the inverting input of audio amplifier AA1. Connected to the output 240a of audio amplifier AA1 is a loudspeaker 250.

Figure 6:
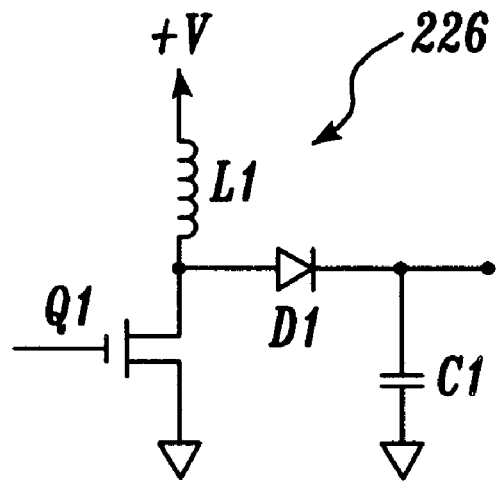
FIG. 6 is a schematic diagram of an inductive power converter of FIG. 5 for supplying positive amplifier operating potential.

A basic arrangement of the currently preferred embodiments of the inductive power converter 226 is shown in FIG. 6. The inductive power converter 226 includes a field effect transistor Q1, an inductor L1, a diode D1, and a capacitor C1. The inductor L1 is connected between the positive terminal of the battery or other DC power source (+V in FIG. 6) and the drain electrode of transistor Q1, with the source electrode of transistor Q1 being connected to ground. As noted earlier, the initial embodiments of the invention are configured for use in automobile sound systems that are powered by 12 volt batteries which provide nominal +V of 13 volts. The gate electrode of the transistor Q1 receives the input of the inductive power converter 226, which relative to the arrangement of FIG. 5, is the pulse-width modulated signal supplied by the driver 224. The anode of the diode D1 is connected to a circuit node defined by the junction of the inductor L1 and the drain electrode of transistor Q1, with the cathode of the diode D1 being connected to the output terminal of inductive power converter 226. The capacitor C1 is connected between the cathode of the diode D1 and ground.

In operation, the pulse-width modulated signal provided by driver 224 switches inductive power converter 226 between two operational states. In the first operational state, transistor Q1 is switched ON (driven into conduction), which establishes a circuit path that allows current flow from the system battery (or other DC power source) through the inductor L1 via the drain-to-source channel of transistor Q1. In the second operational state, transistor Q1 is switched OFF to interconnect inductor L1 with capacitor C1 so that inductor L1 provides charging current to the capacitor C1.

Basic operation of inductive power converter 226 in the first operational state is as follows. Assuming that the inductive power converter 226 was operating in accordance with the invention immediately prior to the time at which switching occurs (i.e., the circuit is not in an initial "start-up" mode), certain initial conditions exist that are determined by the state of the circuit immediately prior to switching to the first operational state (at the end of the next-most antecedent second operational state). Specifically, when transistor Q1 switches inductive power converter 226 to the first operational state, current is flowing through inductor L1 and a corresponding voltage is developed across inductor L1 in a direction that opposes the current flow through the inductor (i.e., a back EMF is present). In addition, capacitor C1 is charged to a voltage, which, at the time of switching, slightly exceeds the positive potential required by the audio amplifier circuitry 240 of FIG. 5. Since the current flowing through inductor L1 cannot change instantaneously, that same current initially flows through inductor L1, the drain-to-source channel of transistor Q1 and the system battery (or other DC power source) when inductive power converter 224 switches to the first operational state. Assuming that the drain-to-source resistance of transistor Q1 is substantially less than the load resistance presented by the audio amplifier circuitry 240 and that the initial voltage across capacitor C1 (the positive operating potential being supplied to audio amplifiers circuitry 240) is either greater than or at least nearly equal to the sum of the small voltage drop across transistor Q1 and the battery (or other DC power source) voltage, current flow through inductor L1 while inductive power converter 224 is in the first operational state is given by the expression $$i_{L1} = i_{L1}(t_0) + \frac{V}{R}(1 - e^{Rt/L})$$

where V represents the voltage being supplied to inductive power converter 226 by the system battery or other DC power source (+V, in FIG. 6); L is the inductance value of inductor L1; and R represents the sum of the drain-to-source channel resistance of transistor Q1, the DC resistance of inductor L1, and the source resistance presented by the battery or other DC power source that supplies the voltage V; e represents the base value of the natural log system; and, t represents time measured from the point at which switching occurs. In the practice of the invention, the transistor Q1 exhibits low drain-to-source resistance when the transistor is in the conducting state and both the DC resistance of L1 and the internal resistance of the battery are low. The current through inductor L1 remains essentially constant throughout the period of time that the pulse-width modulated signal supplied by driver 224 maintains inductive power converter 226 in the first operational state for any given power level. This is because the time constant of the inductor is large compared to the pulse period. It does increase a small amount.

It can be noted that while inductive power converter 226 is in the first operational state, capacitor C1 continues to provide the current required to supply positive operating potential to the audio amplifier circuitry 240 of FIG. 5. Thus, during the second operational state, the voltage across capacitor C1 decreases by an amount equal to:

$$1/C \int_{t_0}^{t_1} i dt$$

where C is the capacitance value of capacitor C1, i is the current being supplied to the positive power input of audio amplifier AA1, $t_0$ is the time at which inductive power converter 226 switches into the first operational state and t denotes any time within the time interval $t_0$ to $t_1$, where $t_1$ represents time at which inductive power converter is switched from the first operational state to the second operational state. In the practice of the invention, the frequency (pulse repetition rate) of the pulse-width modulator 222 is relatively high (on the order of 130 kilohertz in the currently preferred embodiment) so that there is minimal change in the voltage across the capacitor during the period of time in which the inductive power converter 226 is in the first operational state (i.e., the capacitor voltage remains above the positive operating potential required by audio amplifier AA1).

When the pulse-width modulated signal provided by driver 224 switches inductive power converter 226 into the second operational state, transistor Q1 turns OFF (becomes nonconducting) so that the drain-to-source channel resistance of the transistor substantially exceeds the equivalent resistance of the audio amplifier circuitry 240 of FIG. 5 (i.e., substantially exceeds the ratio of the voltage across capacitor C1 to the current being supplied to the audio amplifier circuitry 240 by the inductive power converter 226). Since the current that is flowing through inductor L1 at the time the circuit is switched to the second operational state cannot change instantaneously, the same amount of current initially flows through diode D1. Thus, at the beginning of the second operational state of inductive power converter 226, a charging current flows through capacitor C1 that is equal to the difference between the current flowing through inductor L1 and the current being provided to audio amplifier circuitry 240.

The time rate-of-change in the charging current supplied to capacitor C1 by inductor L1 during the second operational state is influenced by several factors. First, the circuit path through which inductor L1 supplies current for charging capacitor C1 presents a complex impedance that involves both the inductance and DC resistance of inductor L1 and the capacitance of capacitor C1. This means that the decrease in the current provided by inductor L1 is defined by a series of exponential terms in which the time constants differ from one another, but each involve the inductance of inductor L1 and the capacitance of capacitor C1. The second condition that effects the charging current supplied to capacitor C1 by inductor L1 is the fact that inductive power converter 226 supplies operating current to the positive power input of audio amplifier AA1 throughout the duration of the second operating state. In addition, when inductive power converter 226 is switched into the second operating state, capacitor C1 is charged to a voltage that slightly exceeds the positive operating potential required by audio amplifier AA1, at the time switching occurs (i.e., the time at which operation in the next most antecedent second operational state ended).

Although the above-mentioned factors influence the charging currents supplied to capacitor C1 during the second operational state of inductive power converter 226 (and hence affect the increase in positive operating potential supplied to audio amplifier AA1), the important point from the standpoint of circuit operation is that the charging current (and hence the increase in operating potential supplied by inductive power converter 226) can be controlled through selection of circuit component values (primarily the inductance value of inductor L1 and the capacitance value of capacitor C1 and, if needed, by adding additional resistance in the inductor-capacitor current path). Further, since the amplitude of the current flow through inductor L1 during operation in the first operational state is determined by the value of inductor L1 and the power requirements (whereas the capacitance of capacitor C1 has a major influence on charging of capacitor C1 during the second operational state), capacitance and inductance values can be selected that optimize the performance of inductive power converter 226.

Figure 1A:
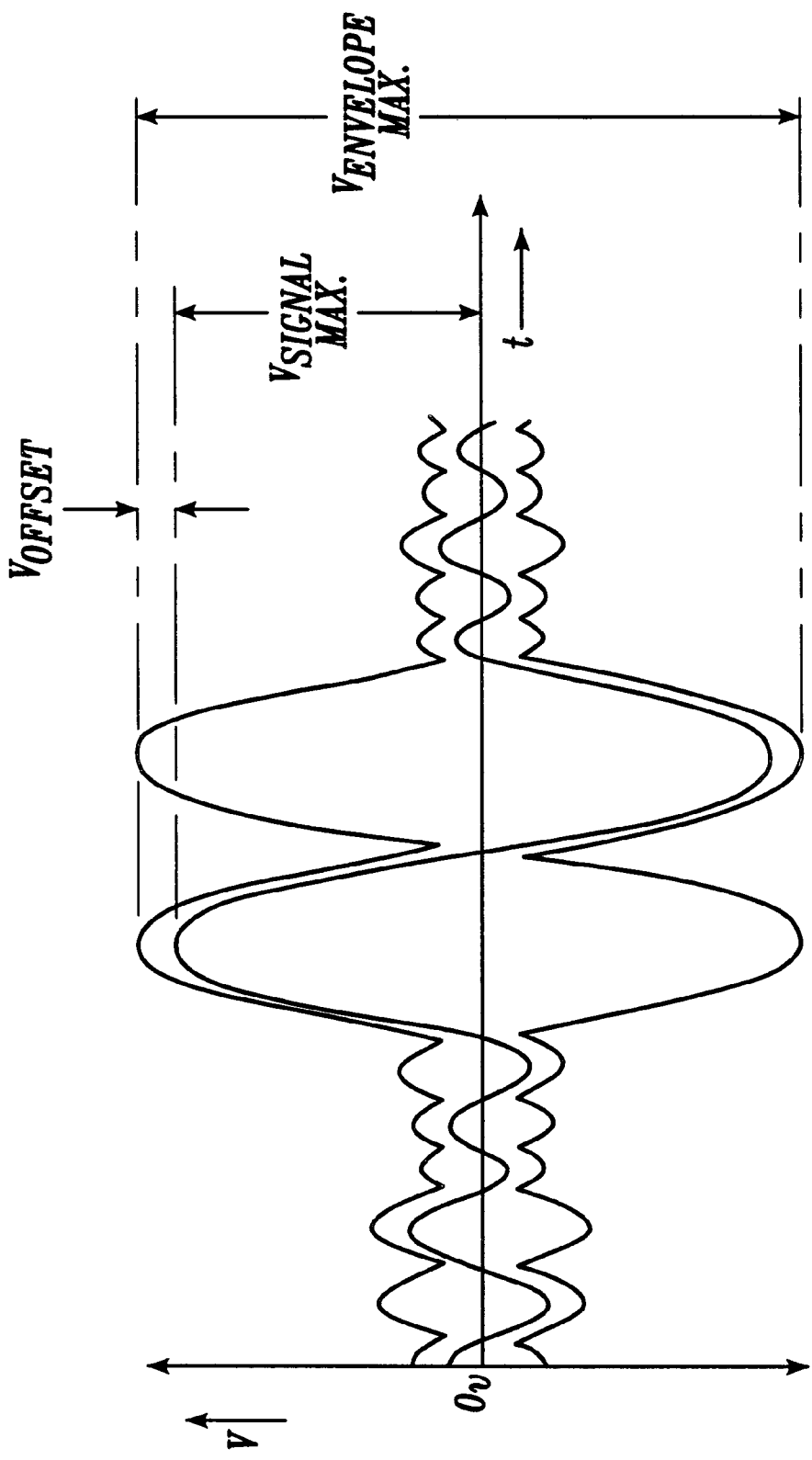
FIGS. 1A, 1B and 1C depict wave shapes illustrating the operation of an envelope tracking power supply, a ground-to-rail tracking power supply, and a rail-to-rail tracking power supply, respectively.
Figure 1B:
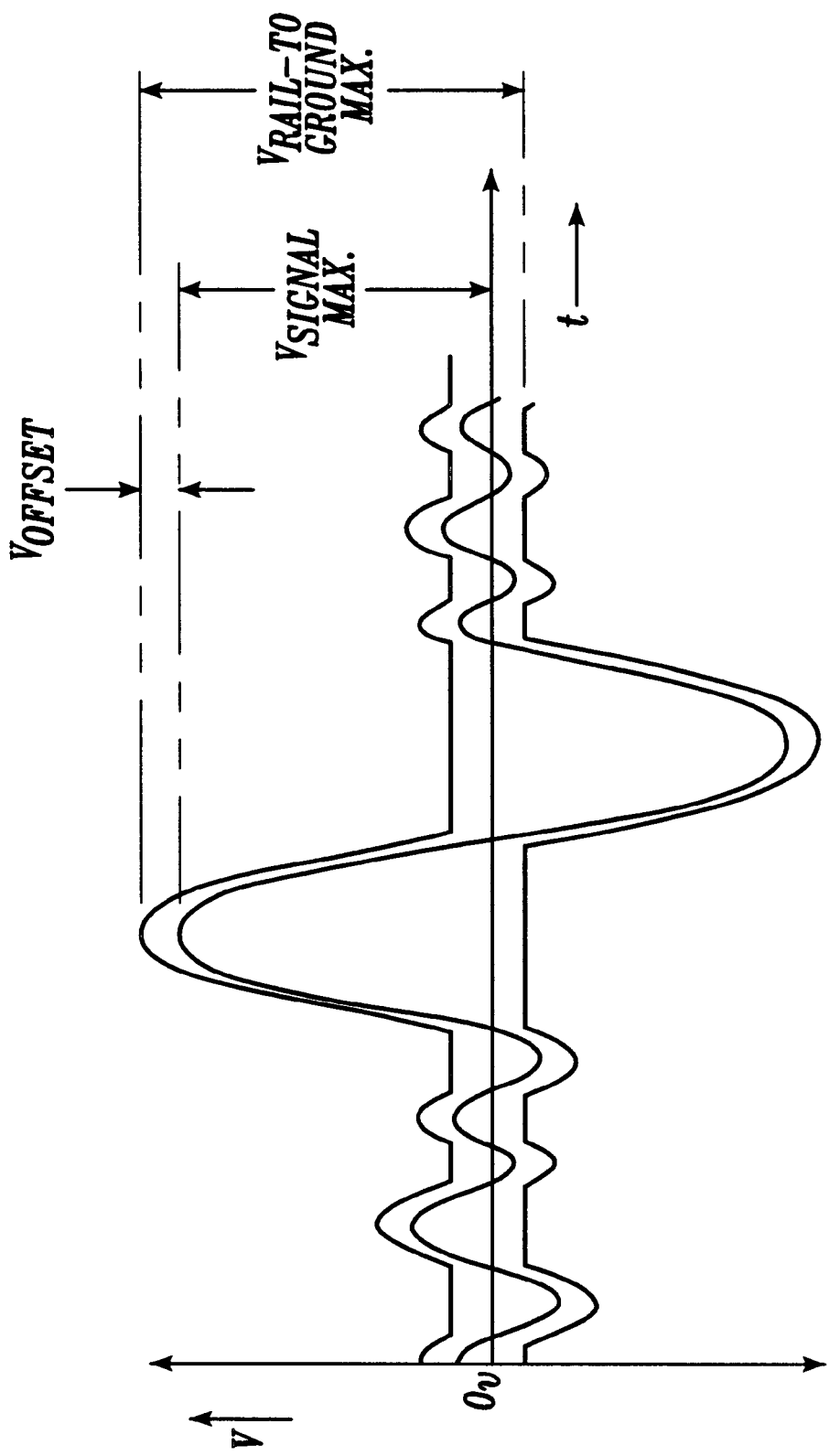
Figure 1C:
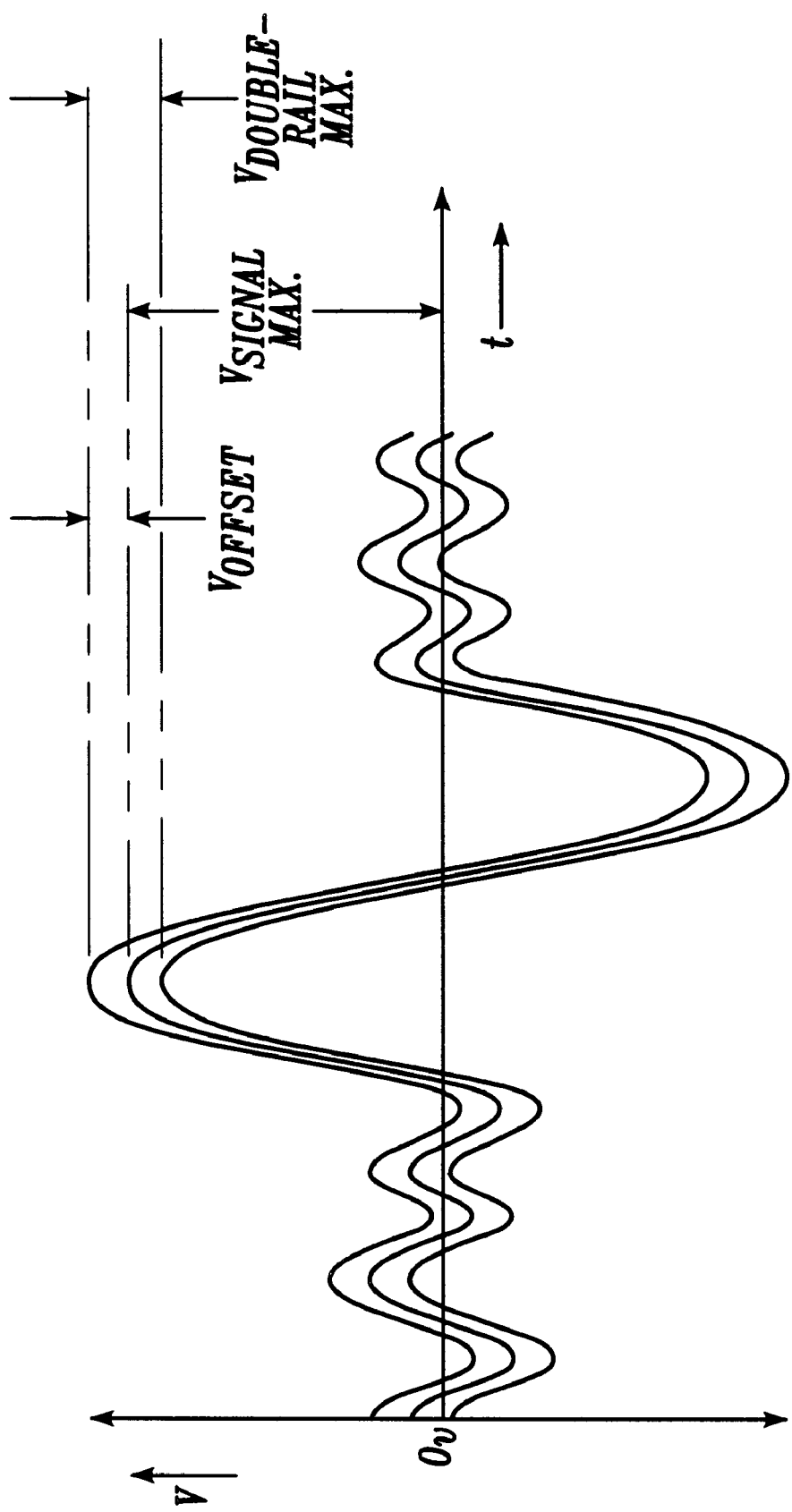

The selection of component values for inductor L1 and capacitor C1 and additional aspects of the invention can be recognized by considering operation of inductive power converter 226 relative to each period of the pulse-width modulated signal provided by pulse-width modulator 222 and driver circuit 224. Specifically, the leading edge of each pulse delivered to inductive power converter 226 causes inductive power converter 226 to switch into the first operational state and the trailing edge of that pulse causes inductive power converter 226 to switch into the second operational state. Thus, during each period of the pulse-width modulated signal, the ratio of the time during which the inductive power converter 226 is in the first operational state and the time it is in the second operational state is substantially identical to the duty cycle exhibited by the pulse-width modulated signal during that period of time. In the practice of the invention, the component values of inductor L1 and capacitor C1 and the feedback supplied from the output of inductor power converter 226 to reference amplifier 220 are selected so that inductive power converter 226 supplies a predetermined voltage offset to audio amplifier circuitry 240 when no audio signal AS is supplied to steering network 210. That is, under the condition of zero input signal, inductive power converter 226 supplies an output voltage (positive operating potential for audio amplifier AA1) that corresponds to $V_{OFFSET}$ of the rail-to-rail ground power supply wave forms shown in FIG. 1B.

As noted earlier, the width of the pulse delivered to inductive power converter 226 by pulse-width modulator 222 and driver 224 is directly related to the amplitude of the positive signal 210a (and hence the amplitude of the positive portion of the audio signal AS) during that particular period of the pulse-modulated signal. Thus, an increase in the signal level of positive portions of the audio signal AS results in an increase in the length of time that inductive power converter 226 remains in the first operational state and a corresponding decrease in the length of time that inductive power converter 226 is in the second operational state. Increasing the amount of time that inductive power converter 226 is in the first operational state causes a corresponding increase in the current flowing through inductor L1 and hence, an increase in the positive operating potential supplied to audio amplifier AA1 when inductive power converter 226 is switched to the second operational state. On the other hand, a decrease in positive signal 210a results in a corresponding decrease in the width of the pulse supplied to inductive power converter 226 causing the time period in which the inductive power converter 226 operates in the first operational state to decrease and causing the period of time that the inductive power converter operates in the second operational state to increase. Thus, less energy (in the form of capacitor charging current) is transferred to capacitor C1 during the second operational state and the operating current that is being supplied to the positive power input of audio amplifier AA1 by capacitor C1 causes the positive operating potential supplied by inductive power converter 226 to audio amplifier AA1 to decrease (i.e., more energy is supplied to the amplifier by capacitor C1 than is supplied by inductor L1).

In view of the above-described operation, it can be noted that for each positive level of audio signal AS, inductive power converter 226 supplies a corresponding positive amplifier operating potential. As previously noted, in accordance with the invention, the positive potential supplied by inductive power converter 226 is established to slightly exceed the positive operating potential required by audio amplifier AA1 for each particular positive signal amplitude. More specifically, it is a design objective of the invention to establish the positive operating potential supplied to audio amplifier AA1 at a value that exceeds the potential required by the amplifier by a predetermined, fixed amount (6 volts in the currently preferred embodiment of the invention). In that regard, it should be noted by those skilled in the art that the amount by which the positive potential supplied by inductive power converter 226 exceeds the operating potential required by audio amplifier AA1 will not remain absolutely constant since, as previously mentioned, the potential will decrease slightly as the inductive power converter 226 continues to supply positive operating current to audio amplifier AA1 during the first operational state of inductive power converter 226. However, since the pulse-width modulation frequency (approximately 135 kilohertz in the currently provided embodiment of the invention) substantially exceeds the frequency range of the signals being amplified, the maximum time duration that inductive power converter 226 remains in the first operational state is short enough that the positive operating potential supplied to audio amplifier AA1 remains above the potential required by the amplifier.

Figure 7:
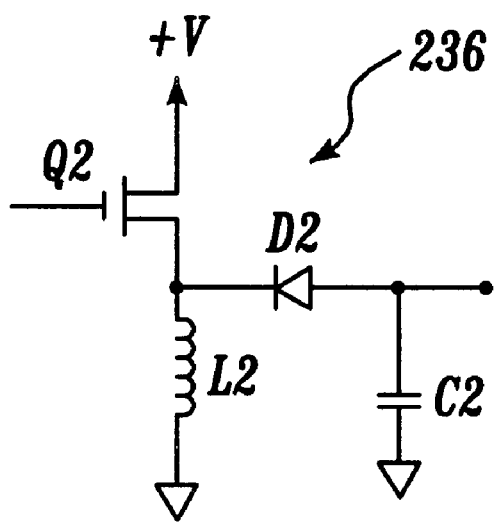
FIG. 7 is a schematic diagram of an inductive power converter of FIG. 5 for supplying negative amplifier operating potential.

A currently preferred embodiment of the inductive power converter 236 is shown in FIG. 7. As previously described, the inductive power converter 236 provides the negative power input for the audio amplifier AA1. The circuit arrangement of inductive power converter 236 is similar to that of inductive power converter 226, and includes a field effect transistor Q2, an inductor L2, a diode D2 and a capacitor C2. The inductor L2 is connected between ground and the source electrode of transistor Q2, with the drain electrode of the transistor Q2 being connected to the positive potential supplied by the system battery or other DC power source. The gate electrode of the transistor Q2 is connected to the input terminal of the inductive power converter 236 which, as described relative to the negative-going tracking up converter of FIG. 5, receives the signal provided by the driver circuit 234. The cathode of the diode D2 is coupled to a circuit node defined by the junction between the inductor L2 and the source electrode of transistor Q2, and the anode of the diode D2 is connected to the output terminal of inductive power converter 236. The capacitor C2 is connected between the cathode of the diode D2 and ground.

The inductive power converter 236 operates similarly to the inductive power converter 226, with the exception that the voltage produced on the capacitor C2 is a negative voltage. In particular, when inductive power converter 236 is in the first operational state, current flows through the drain-to-source channel of transistor Q2 and through inductor L2 to ground. When transistor Q2 switches OFF (enters the second operational state), current continues to flow through inductor L2 removing charge from capacitor C2 to thereby increase the negative potential at the output of the inductive power converter 236.

Figure 8:
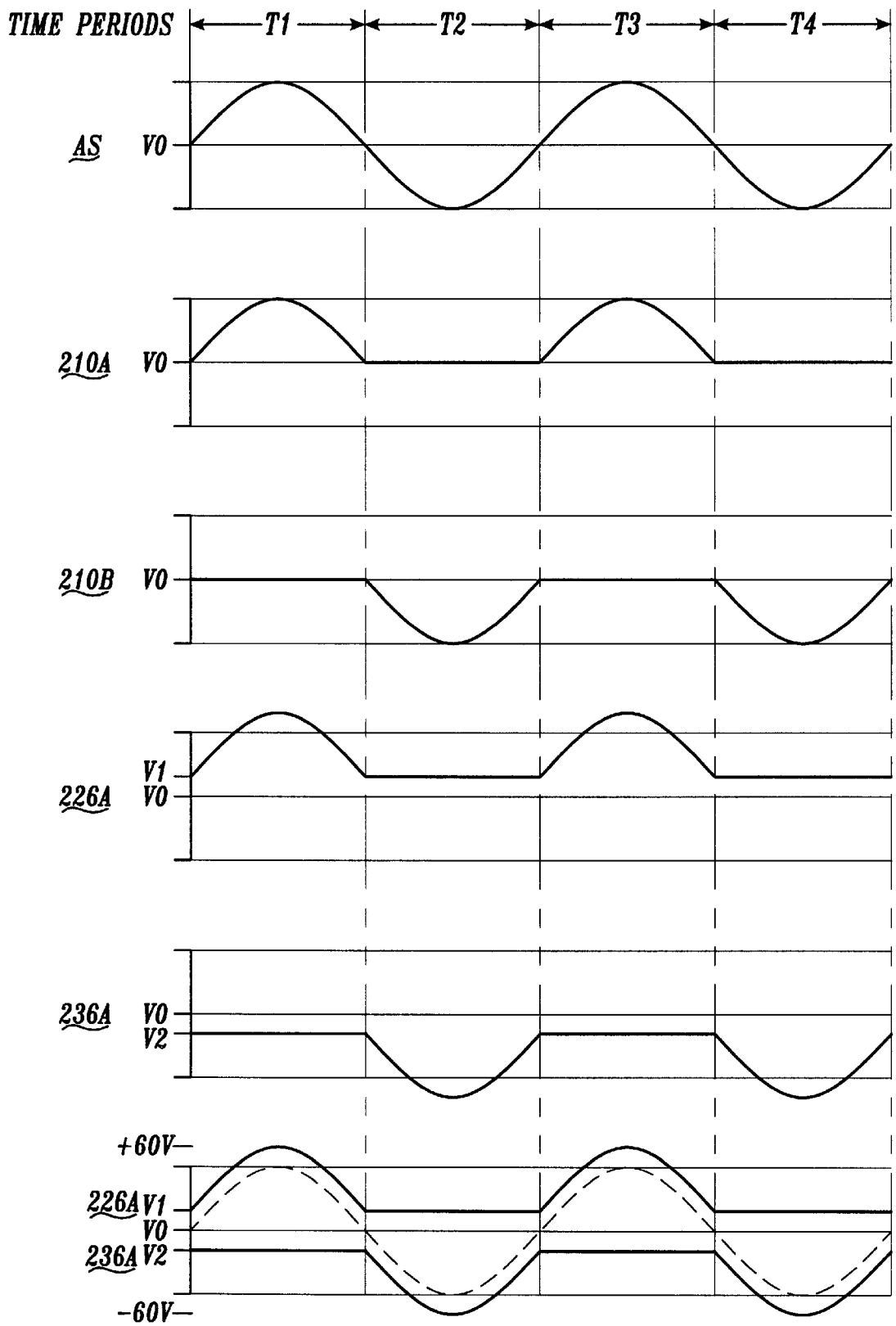
FIG. 8 is a signal diagram illustrating the basic rail-to-ground tracking operation of the circuit of FIG. 5.

FIG. 8 depicts waveforms that illustrate the operation of the rail-to-ground tracking circuit of FIG. 5 for an applied single frequency audio signal. In FIG. 8, the depicted audio signal AS consists of two complete cycles of a constant frequency sinusoidal signal having positive half cycles during time periods T1 and T3, and negative half cycles during time periods T2 and T4. As was described relative to FIG. 5, steering network 210 produces a positive signal 210a that includes the positive portions of the audio signal AS (positive half cycles in FIG. 8) and negative signal 210b that includes the negative portions of the audio signal AS (negative half cycles in FIG. 8).

As indicated in FIG. 8, the output 226a of inductive power converter 226 is substantially the same shape as the positive signal 210a, with the DC or reference level being $V_1$ volts above the initial signal reference level $V_0$. Thus, the voltage offset for the arrangement of FIG. 8 is $(V_1-V_0)$, which in the currently preferred embodiment is 6 volts. It should be recognized that the waveforms of FIG. 8 are not shown to scale in that the peak amplitude of output 226a is substantially higher than the peak amplitude of the depicted positive signal 210a.

As previously discussed and as shown in FIG. 8, the waveshape of the output 236a of the inductive power converter 236 is substantially the same as the negative signal 210b, with signal 236a having a negative DC component $V_2$ relative to the initial reference signal level $V_0$. Thus, the offset voltage of signal 236a is $(V_0-V_2)$, which in the currently preferred embodiment of the invention is established equal to the positive offset voltage end is 6 volts. As is the case with the depicted waveforms 210a and 226a, waveforms 210b and 236a are not shown to scale in FIG. 8, with the waveform 236a essentially being an amplified signal corresponding to the waveshape of negative signal 210b with a negative offset voltage of $-V_2$ volts.

The lower-most set of waveforms in FIG. 8 includes waveforms 226a, 236a, and the audio output signal provided by audio amplifier AA1 (shown by a dotted line). As is indicated in FIG. 8, the waveforms 226a and 236b respectively track the positive and negative portions of the audio output signal with nominal offset voltages of $+V_1$ volts and $-V_2$ volts.

As previously noted, the offset volts will vary somewhat during each period of the pulse-width modulated signal that is provided to the inductive power converters (e.g., inductive power converters 226 and 236 of FIGS. 6 and 7). Specifically, the magnitude of the voltage offsets decrease below the nominal offset values during the first operational states of the inductive power converters (energy being supplied to the inductors in the form of increased current flow while the capacitors continue to supply audio amplifier operating current). On the other hand, the magnitude of the voltage offsets increase above nominal offset value during the second operational states while the inductors supply charging current to the capacitors. However, the variation in the offset volts can be maintained at levels that do not adversely affect operation of the invention. In particular, in the practice of the invention, the pulse frequency of the pulse-width modulated signal is substantially higher than the highest frequency audio signal of interest. For example, in the currently preferred embodiment of the invention is incorporated in a subwoofer system for an automobile sound system with the pulse frequency of the pulse-width modulated signal being 135 kilohertz, which is more than 100 times the highest frequency of the subwoofer signals. Moreover, as previously noted, the time constants that govern the current build-up in the inductors of the inductive power converters and the time constants that govern the charging of the capacitors can be established to maintain variation in the voltage offsets at an acceptable low level and, in addition, ensure satisfactory rail-to-rail tracking over a significant range of audio signal amplitudes. In that regard, the currently preferred embodiment, which employs an offset voltage of 6 volts and is powered by a standard automobile battery, is capable of supplying maximum positive and negative amplifier operation potentials (rail voltages) on the order of 60 volts and, as a result, is capable of producing peak power output on the order of 500 watts when the audio amplifier is connected to a 4 ohm speaker having a high-back EMF voicecoil. Because of the efficiency provided by the invention and the lack of circuit complexity, one realization of the invention is mounted in a 3-inch by 5-inch by 1⅛-inch enclosure, thus being suited for inclusion in the housing for the audio system loudspeaker or an enclosure that contains other components of a sound system.

Figure 9A:
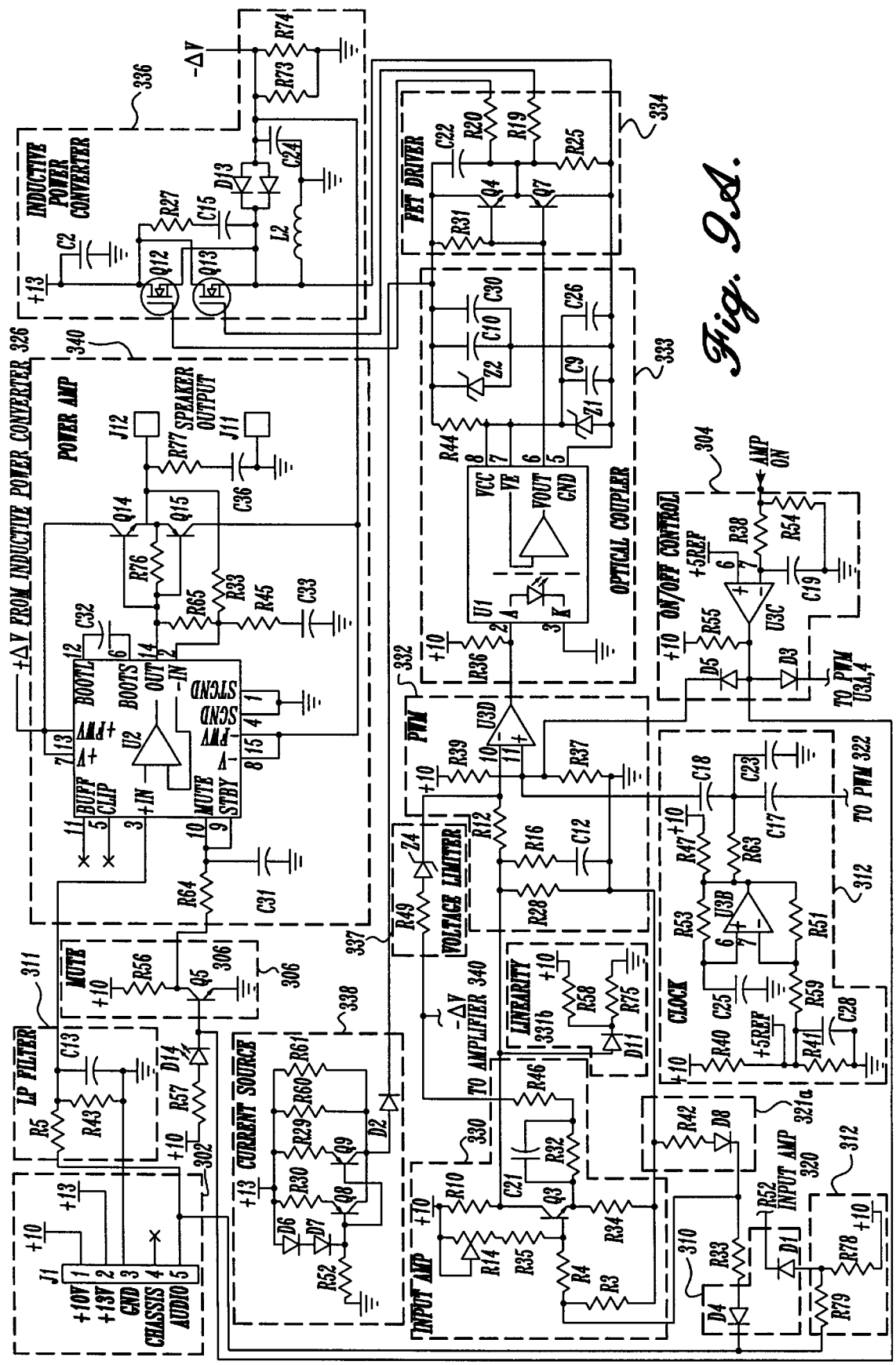
FIGS. 9A and 9B collectively depict a detailed schematic diagram of one embodiment of an amplifier and rail-to-ground tracking power supply according to the present invention.
Figure 9B:
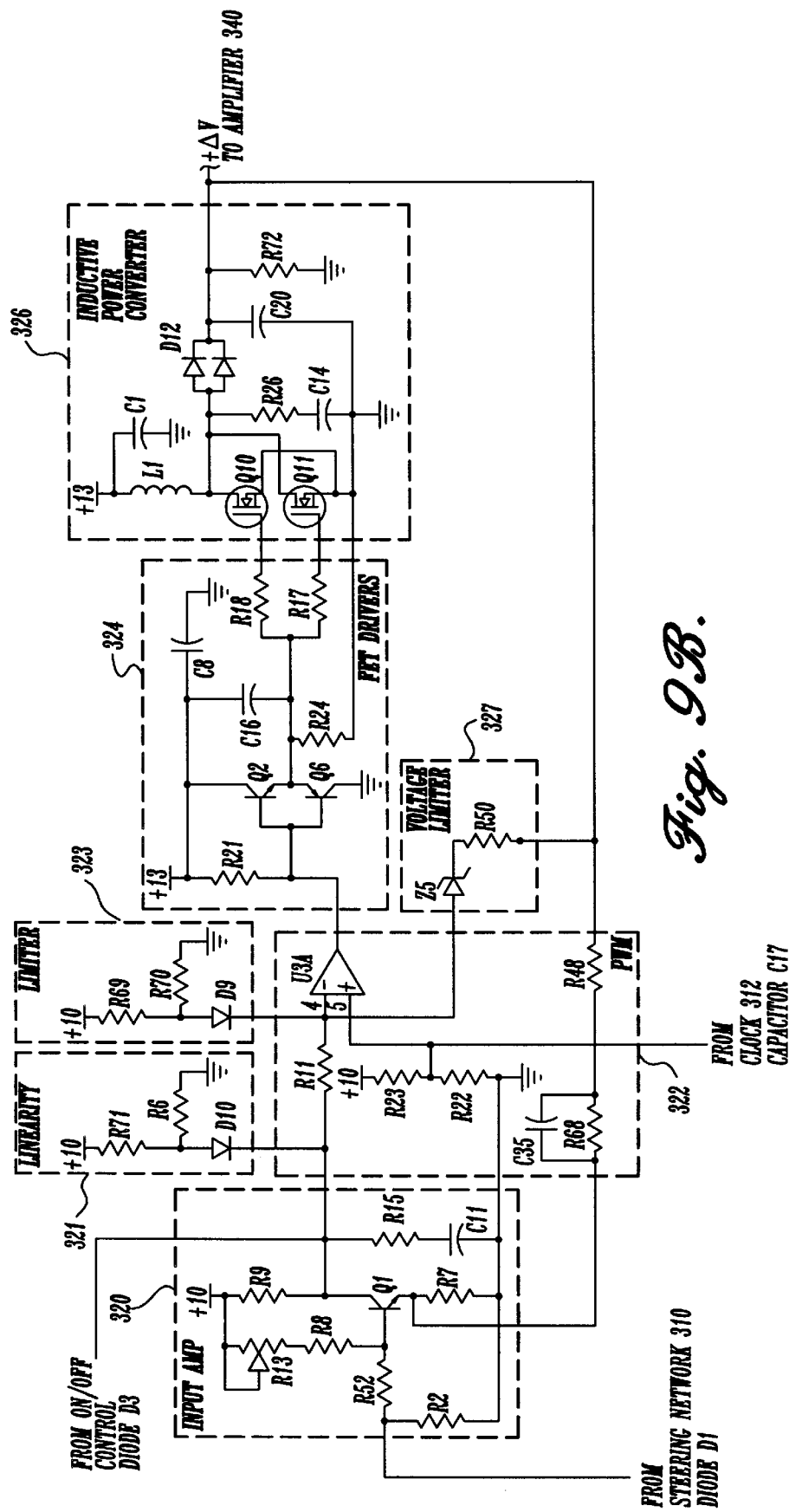

FIGS. 9A and 9B collectively depict the currently preferred embodiment of the invention, which is a prototype unit designed for use with a 12 volt automobile battery or other DC source. As illustrated in FIG. 9A, the audio and power input for the depicted arrangement is supplied to a connector 302 with a +10 supply voltage being supplied to pin 1 of the depicted connector; the positive and negative battery terminals being connected to pins 2 and 3; a chassis ground being connected to pin 4, and the audio signal being connected to pin 5.

The audio input signal is supplied by pin 5 of the connector 302 to a low-pass filter 311, which includes a resistor R5, a resistor R43, and a capacitor C13. In lowpass filter 311, resistor R43 and capacitor C13 are connected in parallel between ground and one end of resistor R5 with the other end of resistor R5 being connected for receiving the audio input signal supplied to pin 5 of connector 302. In the currently preferred embodiment of the invention, lowpass filter 311 of FIG. 9 is designed for subwoofer range audio signals (from 20 Hz to 120 Hz). However, it will be recognized that the filter can be configured for higher frequency arrangements, to thereby configure the tracking power supply and audio amplifier 300 for operation over a wider range of audio signals such as the entire audio frequency range.

The output signal provided by lowpass filter 311 is connected to an audio amplifier 340, which includes a power amplifier U2 and a conventionally configured complementary output stage. In the depicted arrangement, the output signal of the lowpass filter 311 is connected to pin 3 of power amplifier U2, which receives positive operating potential that tracks positive portions of the applied audio signal at pins 7 and 13. Negative operating potential that tracks negative portions of the applied audio signal is supplied to pins 8 and 15. Pins 1 and 4 are connected to ground. The input MUTE (pin 10) and the input STBY (pin 9) are coupled through a capacitor C31 to ground, and are also coupled through a resistor R64 to a mute circuit 306, that will be described in more detail. The input BOOTL (pin 12) is coupled through a capacitor C32 to the input BOOTS (pin 6). Feedback is supplied to the inverting input (pin 2) of power amplifier U2 by means of a resistor R65 that is connected between the power amplifier inverting input and the amplifier output terminal (pin 14), with a series connected resistor R45 and capacitor C33 being connected between the amplifier inverting input and ground. The output signal provided at pin 14 of power amplifier U2 is supplied to the commonly connected base electrodes of transistors Q14 and Q15. Connected between the commonly connected base electrodes and commonly connected emitter electrodes of transistors Q14 and Q15 is a resistor R76. The collector electrodes of transistors Q14 and Q15 are respectively connected for receiving the positive operating potential that tracks positive portions of the applied audio signal and the operating potential that tracks negative portions of the applied audio signal. A series connected resistor R77 and capacitor C36 are connected between ground and the commonly connected emitters of transistors Q14 and Q15 (i.e., between the output terminals of audio amplifier 340).

An on/off control circuit 304 is included in the currently preferred embodiments of the invention to control amplifier muting and switching of the depicted circuit between the on and off states. The depicted on/off control circuit 304 includes resistors R38, R54, R55, a capacitor C19, an amplifier U3C, and diodes D3 and D5. Resistor R54 is coupled between ground and a power switch (not shown) that connects resistor R54 to the positive battery potential when the amplifier is turned on. Resistor R38 is connected between the ungrounded end of resistor R54 and the inverting input of amplifier U3C. Capacitor C19 is connected between the inverting input of amplifier U3C and ground. The noninverting input of amplifier U3C is coupled to a 5 volt DC reference. Resistor R55 is coupled between the amplifier 10 volt supply voltage and the output of terminal amplifier U3C. The anode of diode D5 is coupled to the output of amplifier U3C. The cathode of diode D5 is connected to the noninverting input amplifier U3D that is located in pulse-width modulator 332. In a similar manner, the anode of diode D3 is connected to the output of amplifier U3C, with the cathode of diode D3 being connected to the noninverting input of an operational amplifier U3A pulse-width modulator 322.

With continued reference to FIG. 9A, the currently preferred embodiments of the invention also include a muting circuit 306 consisting of a transistor Q5 having its base electrode connected for receiving the signal supplied at the output of amplifier U3C of the on/off control circuit 304; its emitter electrode connected to ground; and its collector electrode connected to the 10 volt reference via a resistor R56. In addition, the collector of the muting circuit 306 is coupled to the previously mentioned mute input (pin 10) of power amplifier U2 of audio amplifier 340 via capacitor C31 and resistor R64.

In operation, the on/off control circuit 304 and muting circuit 306 function as follows. When the system power switch is off, the output terminal of amplifier U3C is held at a potential of 10 volts via resistor R55, which is connected between the output terminal of amplifier U3C and the 10 volt reference. Thus, the anodes of diodes D3 and D5 also are at a 10 volt potential, which disables pulse-width modulators 322 and 332 (described below). In addition, the 10 volt potential at the output of amplifier U3C maintains transistor Q5 of muting circuit 306 in a conducting state so that power amplifier U2 is held in a muted condition under which no audio signal is coupled to the loudspeaker that is driven by audio amplifier 340. This muting arrangement is particularly advantageous in applications in which the invention operates as a subwoofer amplifier in that the sound system can be operated with or without the subwoofer and no sound will be emitted from the subwoofer loudspeaker when the sound system is operated without a subwoofer capability.

When the system power switch is turned on to activate the arrangement of FIGS. 9A and 9B capacitor C19 of the on/off control circuit 304 charges via resistor R38, which causes the output terminal of amplifier U3C to switch to a potential of approximately 0 volts. Thus, the anodes of diodes D3 and D5 and the base electrode of transistor Q5 of the muting circuit are each at a potential of approximately 0 volts. This reverse biases diodes D3 and D5, which in turn enables the hereinafter described pulse-width modulators 322 and 332. In addition, transistor Q5 of the muting circuit switches off, thereby charging capacitor C31 which switches power amplifier U2 of audio amplifier 340 from the muted state. In addition, when the system power switch is on, current flows from the 10 volt supply through the series combination of a resistor R57 and a light emitting diode D14 (shown in FIG. 9A) to provide a visual indication that the audio amplifier is energized.

The currently preferred embodiments of the invention include a clock circuit 312 that is shown in FIG. 9A and generates a 100-kilohertz triangular wave to establish the frequency of the pulse-width modulators 322 and 332.

Clock circuit 312 of FIG. 9A includes resistors R40, R41, R51, R53, R59, R47, R63, capacitors C17, C18, C28, C25, C23, and amplifier U3B. Resistor R40 is coupled between the 10 volt and 5 volt supply voltages. Resistor R41 is connected in parallel with capacitor C28 between the 5 volt supply and ground. Resistor R59 is connected between the 5 volt supply and the noninverting input of the amplifier U3B. Capacitor C25 is connected between ground and the inverting input of amplifier U3B. Resistor R47 is connected between the 10 volt supply and the output of amplifier U3B. Resistor R51 provides feedback to the noninverting input of amplifier U3B from the output of amplifier U3B, with resistor R53 providing feedback to the inverting input of amplifier U3B from the amplifier output. The output of amplifier U3B, which is coupled through a resistor R63 is supplied to a pulse-width modulator 322 via a capacitor C17 and is supplied to pulse-width modulator 332 via a capacitor C18. A capacitor C23 is connected between ground and the junction between capacitors C17 and C18.

The positive and negative signals that are used to generate the positive and negative tracking potentials for power amplifier U2 of audio amplifier 340 are supplied in the arrangement of FIGS. 9A and 9B by a steering network 310, which includes diodes D1 and D4. In the depicted arrangement, the audio input signal supplied to the anode of diode D1 is clamped to a DC reference level by a voltage divider that is formed by resistors R78 and R79. Specifically, resistors R78 and R79 form an anti-drift circuit 312 in which two the resistors are connected in series between pin 5 of the input connector 302 (audio input) and the 10 volt supply with the anode of diode D1 being connected to the junction between resistors R78 and R79. Diode D1 couples the positive portions of the audio signal pass through diode D1 to an input amplifier 320 (FIG. 9B), which includes resistors R2, R7, R8, R9, R48, R52, R68, a variable resistor R13, capacitor C35, and a transistor Q1. The positive signal provided by diode D1 is coupled to the base electrode of transistor Q1 via a resistor R52. A resistor R2 is connected between ground and one end of resistor R52. Bias is supplied to the base of transistor Q1 by means of resistor R8 and a variable resistor R13 which are connected in series between the base electrode of transistor Q1 and the 10 volt supply. The collector of transistor Q1 is connected through a resistor R9 to the 10 volt supply. A resistor R7 couples the emitter of Q1 to ground. A resistor R15 and a capacitor C11 are connected in series between the collector of transistor Q1 and ground. The emitter of the transistor Q1 receives feedback from inductive power converter 326 (described below) via resistor R48, which is connected in series with the parallel combination of resistor R68 and capacitor C35.

Pulse-width modulator 322 of FIG. 9B includes an operational amplifier U3A that is configured as a voltage comparator and has its non-inverting input terminal connected for receiving the triangular timing pulses supplied via capacitor C17 of clock circuit 312. Bias is applied to the noninverting input terminal of the comparator via a voltage divider consisting of resistors R23 and R22 which is connected between the 10 volt supply and ground. The amplified positive signal supplied by input amplifier 320 is coupled from the collector of transistor Q1 of input amplifier 320 to the inverting input terminal of the pulse-width modulator comparator (operational amplifier U3A) via a resistor R11. Connected between the 10 volt supply and ground is a voltage divider consisting of resistor R71 and resistor R6. A diode D10 is connected between the junction of resistors R71 and R6 and the collector of transistor Q1, with the cathode of the diode being connected to the collector. The combination of resistor R71, resistor R6, and diode 10 function as a linearity control (321 in FIG. 9B) that improves system linearity relative to the relationship between the amplitude of the positive audio input signal supplied to input amplifier 320 and the duty cycle of the signal produced by pulse-width modulator 322. Connected to the inverting input of operational amplifier U3A of pulse-width modulator 322 is the cathode of a diode D9. The anode of diode D9 is connected to the junction between resistors R69 and R70, which form a voltage divider that is connected between the 10 volt supply and ground. The combination of resistor R69, resistor R70, and diode D9 functions as a limiter circuit (323 in FIG. 9B) that establishes the maximum duty cycle for pulse-width modulator 322 (and hence the maximum output power of audio amplifier 340 of FIG. 9A). Also connected to the inverting input terminal of operational amplifier U3A of pulse-width modulator 322 is a voltage limiter 327 that consists of a Zener diode Z5 and a resistor R50 that are connected in series between the inverting input of operational amplifier U3A and the output terminal of inductive power converter 326. In operation, if the voltage produced by inductive power converter 326 (i.e., the positive operating potential supplied to audio amplifier 340) exceeds the avalanche voltage of Zener diode Z5 (70 volts in a current realization of the embodiment shown in FIG. 9B), the voltage at the inverting input terminal of operational amplifier U3A increases. The increase in voltage at the inverting input terminal of operational amplifier U3A decreases the output signal supplied by the operational amplifier, which in turn, reduces the duty cycle of the pulse-width modulated signal provided by operational amplifier U3A and thereby limits the voltage provided by inductive power converter 326.

The pulse-width modulated signal supplied by operational amplifier U3A is provided to an FET driver 324, which includes resistors R17, R18, R21, R24, capacitors C8, C16, and transistors Q2 and Q6. Resistor R21 is coupled between the positive supply voltage (nominally 13 volts for a 12-volt automobile battery) and the commonly connected base electrodes of transistors Q2 and Q6. The collector of transistor Q2 is connected to the 13 volt supply, with the emitter of transistor Q2 being connected to the emitters of transistor Q6 and the collector of transistor Q6 being connected to ground. Capacitor 16 is coupled between the collector of transistor Q2 and the emitter of transistor Q2 and resistor R24 is connected between the emitter of transistor Q2 and ground. The output signal, which is provided at the junction between the emitter electrodes of transistors Q2 and Q6, is supplied via resistors R17 and R18 to the gate electrodes of field effect transistors Q11 and Q10 of inductive power converter 326.

The inductive power connector 326 includes an inductor L1, which is connected between the 13 volt supply and the commonly connected drain electrodes of field effect transistors Q10 and Q11. The source electrodes of transistors Q10 and Q11 are connected to ground. A resistor R26 and a capacitor C14 are connected in series between inductor L1 and ground to eliminate high voltage spikes that may occur when field effect transistors Q10 and Q11 switch states. A diode D12 is connected between inductor L1 and the output of inductive power converter 326, which is indicated in FIG. 9B as a signal +ΔV. Capacitor C20, which is charged by current supplied by inductor L1, and a resistor R72 are coupled in parallel between the output of inductive power converter 326 and ground.

In view of the above description, it can be noted that the input amplifier 320, pulse-width modulator 322, FET driver 324, and inductive power converter 326 collectively form a positive-going tracking-up converter that operates in accordance with this invention. That is, the combination of those elements provides positive power input for an audio amplifier (340 in FIG. 9A) which tracks the positive portions of an applied audio signal and, when needed by the audio amplifier, provides positive amplifier operating potential that substantially exceeds the battery or other source that provides power to the tracking-up converter.

In the arrangement of FIG. 9A for supplying negative operating potential to the audio amplifier 340, diode D4 of steering network 310 provides the negative portions of the applied audio signal to an input amplifier 330, which exhibits the same circuit topology as input amplifier 320 of the positive-going tracking-up converter arrangement of FIG. 9. Specifically, the input signal is supplied to the base of a transistor Q3 via series connected resistors R33 and R4. Connected between ground and the junction of resistors R3 and R4 is a resistor R3. Connected between the 10 volt supply and the base electrode of transistor Q3 is the series connected combination of a variable resistor R14 and a resistor R35. Connected between the 10 volt supply and the collector of transistor Q3 is a resistor R10. A resistor R34 is connected between the emitter electrode of transistor Q3 and ground, with a feedback circuit consisting of a resistor R46 that is connected in series with the parallel combination of a resistor R32 and a capacitor C21 being connected between the emitter electrode of transistor Q3 and the output terminal of inductive power converter 336. Although the topology of input amplifier 330 is the same as the topology of input amplifier 320, it should be noted that the corresponding component values are not identical since input amplifier 320 is biased for amplifying the positive portions of the audio input signal and input amplifier 330 is biased for amplifying the negative portions of the audio input signal.

Connected across resistor R3 in the input circuit of input amplifier 320 is a linearity control 321A consisting of a resistor R42 and a diode D8. Specifically, resistor R42 is connected between ground and the anode of diode D8 with the cathode of diode D8 being connected to the junction between resistor R4 and resistor R33.

The bias and coupling network that interconnects the collector of transistor Q3 of input amplifier 330 with pulse-width modulator 332 is similar to the arrangement used in the previously described positive-going tracking-up converter of FIGS. 9A and 9B. Specifically, a linearity control 331B, is connected to the collector of transistor Q3 to compensate for circuit nonlinearity. The depicted linearity control 331B includes resistors R58 and R75 that are connected in series between the 10 volt supply and ground with the cathode of a diode D1 being connected to the junction between resistors R58 and R75. The anode of diode D11 is connected to the collector of transistor Q3 of the input amplifier 330. In addition, a resistor R12 is connected between the collector electrode of transistor Q3 and the inverting input of an operational amplifier U3D of pulse-width modulator 332. Also connected between the collector electrode of transistor Q3 and ground is the series combination of a resistor R16 and a capacitor C12. It can be noted that the bias and coupling network of the negative-going tracking-up converter differs from that of the positive-going tracking-up converter in that the bias and coupling network of the negative-going tracking-up converter includes a resistor R28 that is connected between ground and the collector of transistor Q3 of input amplifier 330. Resistor R28 functions as a limiter that establishes the maximum duty cycle of pulse-width modulator 332.

Like pulse-width modulator 322 of the positive-going tracking-up converter, pulse-width modulator 332 consists of an operational amplifier (U3D) that is connected to function as a comparator circuit. Specifically, the noninverting input terminal of operational amplifier U3D of pulse-width modulator 332 is biased by a voltage divider consisting of resistors R39 and R37, which are connected between the 10 volt supply and ground. The previously described triangular clock pulse, which is supplied to the noninverting input of operational amplifier U3D is compared with the signal supplied by input amplifier 330 to produce a pulse modulated output signal with the width of the output pulse being representative of the amplitude of the negative signal being provided to the input amplifier 320 via diode D4. A voltage limiter 337 that includes a resistor R49 and a Zener diode Z4 (70 volts in one realization of the embodiment of FIG. 9) is interconnected between the inverting input of operational amplifier U3D and the output of inductive power converter 336 (ΔV in FIG. 9A). Voltage limiter 337 functions in the same manner as voltage limiter 327 of the positive-going tracking-up converter of FIGS. 9A and 9B. That is, in the event that the negative operating potential supplied by inductive power converter 336 to audio amplifier 340 exceeds the avalanche voltage of Zener diode Z4, the duty cycle of pulse-width modulator 332 is decreased to, in turn, decrease the negative potential supplied at the output of inductive power converter 336.

In contrast with the positive-going tracking-up converter, the pulse-width modulated signal of the negative-going tracking-up converter of FIGS. 9A and 9B is not directly coupled to an FET driver circuit. Instead, the pulse-width modulated signal provided by pulse-width modulator 332 is supplied to an FET driver circuit 334 via an optical coupler circuit 333. Optical coupler circuit 333 functions as a level shifter that provides operating potentials for field effect driver circuit 334 and inductive power converter 336 that are referenced to the ungrounded end of inductor L2 of inductive power converter 336 (i.e., the end of the inductor that maintains the negative operating potential supplied by inductive power converter 336 at the proper level by supplying capacitor current).

Optical coupler circuit 333 includes an optical coupler U1, which, in the currently preferred realization of the arrangement shown in FIG. 9A is manufactured by Hewlett-Packard and is identified as device number 8CPL2611. As is indicated in FIG. 9A, the signal provided by pulse-width modulator 332 is coupled to the anode of a light emitting diode that is contained within optical coupler U1 with the cathode of the light emitting diode being connected to ground. A resistor R36 connected between the 10 volt supply and the input of optical coupler U1 provides bias. Operating potential for optical coupler U1 and field effect driver circuit 334 is provided by a current source 338 (described below) and by a circuit that is included in optical coupler 333 and consists of a resistor R44, Zener diodes Z1 and Z2, and capacitors C9, C10, C26, and C30. In this arrangement, current source 338 provides current that flows through the series combination of resistor R44 and Zener diode Z1, with Zener diode Z1 being connected to optical coupler U1 to provide operating potential (5.1 volts in the previously mentioned realization of the embodiment shown in FIGS. 9A and 9B). Current also is supplied from current source 338 to Zener diode Z2, which is connected across the series combination of resistor R44 and Zener diode Z1 to establish the operating potential for field effect driver circuit 334 (15 volts in the referenced realization of the depicted embodiment. Capacitors C9 and C26 are connected in parallel with Zener diode Z1 and capacitors C10 and C30 are connected in parallel with Zener diode Z2.

Current source 338 (also shown in FIG. 9A) includes two transistors Q8 and Q9 that provide current to the above-described biasing network of optical coupler 333 and FET driver 334 via a diode D2. Specifically, Q8 and Q9 operate as parallel connected current sources, with the collector electrodes of both transistors being connected to the anode of the diode D2. Base-to-emitter drive current for transistors Q8 and Q9 is provided by diodes D6 and D7, which are connected in series between the 13 volt supply and the commonly connected base electrodes of transistors Q8 and Q9. A resistor R52 connected between ground and the commonly connected base electrodes of transistors Q8 and Q9 maintains diodes D6 and D7 in conduction. Resistors R30 and R29 are respectively connected between the emitter electrodes of Q8 and Q9 and the 13 volt supply, i.e., the system battery or other DC power source. Connected between the 13 volt supply and the commonly connected collector electrodes of transistors Q8 and Q9 are resistors R60 and R61, which are connected in parallel with one another.

Those skilled in the art will recognize that the current required for the biasing network described relative to optical coupler 333 can be supplied by a less complex current source than current source 338 of FIG. 9A. In particular, current could be provided to diode D2 by a single transistor and a single resistor could be substituted for resistors R60 and R61. However, the topology of current source 338 of FIG. 9A is advantageous in applications of the invention in which minimum physical size of amplifier 300 is of importance, e.g., an automotive sound system. In particular, the use of transistors Q8 and Q9 and separate resistors R60 and R61 are advantageous from the standpoint of thermal dissipation in that the components can be mounted in spaced-apart relationship with one another to provide better thermal dissipation characteristics than would otherwise be present.

Returning now to the processing of the pulse-width modulated signal within the negative-going tracking-up converter of FIGS. 9A and 9B, the pulse-width modulated signal provided by U1 of optical coupler circuit 333 is directly connected to the field effect driver circuit 334. Field effect driver circuit 334 is identical in topology to field effect driver circuit 224 of the positive-going tracking-up converter of FIG. 9 with the bias voltage for field effect driver 334 being established by Zener diode Z2 of the optical coupler circuit 333 instead of being established by the 13 volt supply voltage. As shown in FIG. 9A, field effect driver circuit 334 includes an NPN transistor Q4 and a PNP transistor Q7 which are connected to form a compound emitter follower circuit. In this arrangement, the commonly connected bases of transistors Q4 and Q7 are connected for receiving the pulse-width modulated signal supplied by optical coupler circuit 333. A resistor R31 is connected between the commonly connected base electrodes of transistors Q4 and Q7 and the positive operating potential (15 volts) supplied by Zener diode Z2 of the optical coupler 333. The collectors of transistors Q4 and Q7 respectively connect to the cathode and anode of Zener diode Z2. The commonly connected emitter electrodes of transistors Q4 and Q7 are connected to circuit common (the anode of Zener diode Z2) via a resistor R25. A capacitor C22 is connected between the positive operating potential and the commonly connected emitters of transistors Q4 and Q7. In operation, transistors Q4 and Q7 supply the pulse-width modulated signal generated by pulse-width modulator 332 to the gate electrodes of field effect transistors of the inductive power converter 336, with the pulse-width modulated signal being supplied via resistors R19 and R20.

Inductive power converter 336 of FIG. 9A is similar to inductive power converter 326 of the previously described positive-going tracking-up converter (FIG. 9B). In that regard, inductive power converter 336 includes a pair of field effect transistors Q12 and Q13 that are connected with the drain electrodes of each transistor connected to the positive potential supplied by the system battery or other DC power source (13 volt supply in FIG. 9A) and the source electrodes of each transistor being connected to the anode Zener diode Z2 of optical coupler circuit 333 (circuit common for FET driver circuit 334 and inductive power converter 336). An inductor L2 is connected between ground and the commonly connected source electrodes of transistors Q12 and Q13. A resistor R27 and a capacitor C15 are connected between the 13 volt supply and the commonly connected source electrodes of transistors Q12 and Q13. The cathode of a diode D13 also is connected to the commonly connected source electrodes of transistors Q12 and Q13 with the anode of the diode D13 being connected to supply negative operating potential to audio amplifier 340. A capacitor C24 is connected between the anode of diode of D13 and ground.

In operation, inductive power converter 336 of FIG. 9A operates in the manner discussed relative to inductive power converter 236 of FIGS. 5 and 7. In particular, when the pulse-width modulated signal supplied to the gate electrodes of transistors Q12 and Q13 switches the transistors Q12 and Q13 into conduction, current flows from the positive potential of the 13 volt supply through inductor L2, with the magnitude of the current flowing through the inductor increasing exponentially and being determined by the width of the pulse delivered by the pulse-width modulator 332. At the end of the pulse provided by the pulse-width modulator, field effect transistors Q12 and Q13 are switched to the non-conducting state and current continues to flow through inductor L2, being supplied by capacitor C24 via diode D13. Thus, the negative operating potential supplied to audio amplifier 340 increases in magnitude. As was described relative to the arrangement of FIG. 5, in accordance with the invention, the magnitude of the negative operating potential supplied to audio amplifier 340 tracks the negative portion of the audio input signal with the operating potential nominally exceeding the amplitude of the output signal supplied by audio amplifier 340 by a predetermined amount (the negative offset voltage, which is −6 volts in the currently preferred embodiments).

In view of the above description, it can be noted that the input amplifier 330, pulse-width modulator 332, optical coupler 333, FET drivers 334, and inductive power converter 336 collectively serve the same function as amplifier 230, pulse-width modulator 232, driver 234 and inductive power converter 236 of FIG. 5. Thus, the combination components 330, 332, 333, 334, and 336 are within the scope of what is referred to herein as a negative-going tracking-up converter.

Figure 10A:
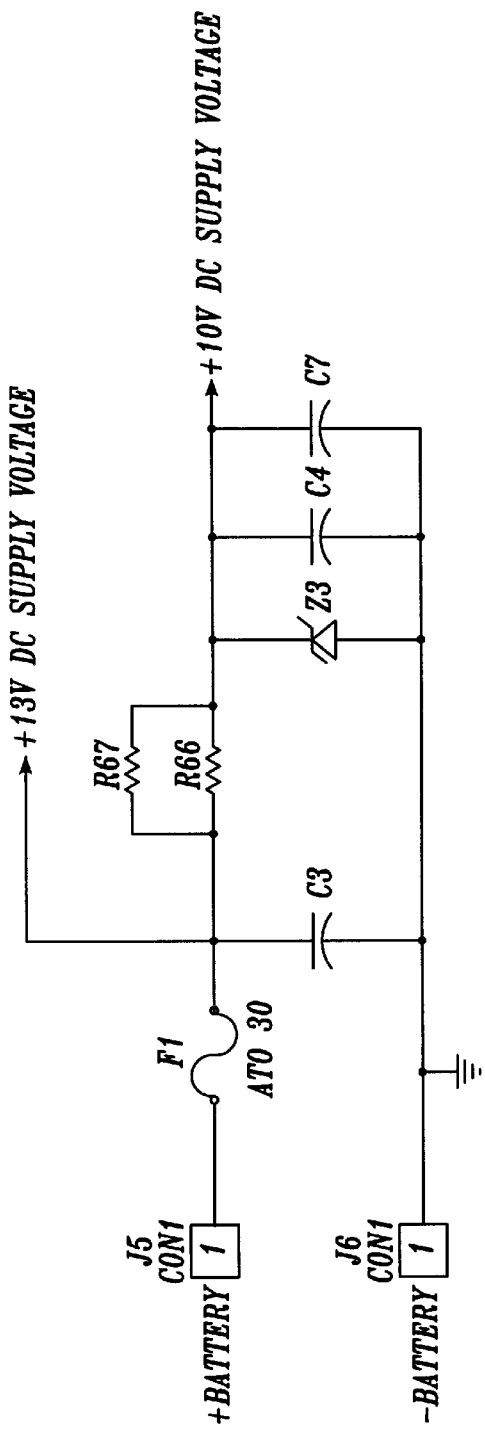
FIGS. 10A and 10B are schematic diagrams illustrating the power connections for the voltage supplies and amplifiers of FIGS. 9A and 9B.
Figure 10B:
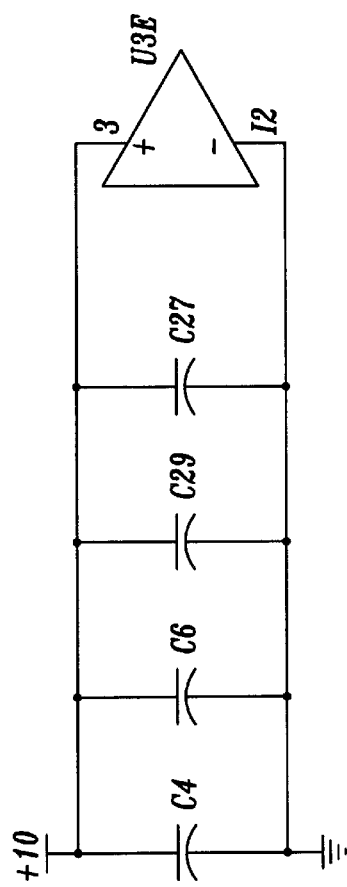

FIG. 10A depicts a circuit arrangement for generating the 10 volt supply voltage used in the circuit of FIGS. 9A and 9B. In FIG. 10A, the series combination of a 10 volt Zener diode Z3 and parallel connected resistors R66 and R67 are connected between the positive and negative terminals of the system power supply, such as an automobile battery. A capacitor C3 that is connected between the positive terminal of the battery and the grounded negative terminal provides filtering. Capacitors C7 and C34 are connected in parallel with one another across Zener diode Z3 to filter the 10 volt supply. As is indicated in FIG. 10B, additional filter capacitors C4, C6, C29 and C27 are connected in parallel with one another between the 10 volt supply and ground in close proximity with amplifiers U3A, B, C and D of FIGS. 9A and 9B to provide additional filtering of the 10 volt supply.

In brief summary, the above-described arrangements of the present invention provide a tracking-up converter in which inductors are switched from a state in which current flow through the inductors increases exponentially to a state in which the inductors in effect discharge the currents in a manner that charge capacitors that supply the positive and negative operating potential to an audio power amplifier. The switches that control the state of the inductors are activated by pulse-width modulated signals that are representative of the audio signal being amplified, thus causing the positive and negative amplifier potentials to track the audio signal in a manner associated with rail-to-ground audio amplifier trackers. Circuit operation is established so that the magnitude of the positive and negative amplifier operating potentials exceed the requirements of the amplifier by predetermined offset voltages.

While preferred embodiments of the invention have been illustrated and described, it will be appreciated that various changes can be made therein without departing from the spirit and scope of the invention. For example, while the disclosed embodiment has been described as being powered by a 13V car battery source, it could obviously also be operated by a higher voltage battery, or other types of dc power sources. Moreover other types of pulse duration modulation could be employed as well as various other arrangements of input amplifiers and steering networks. Even further, upon understanding the manner in which the positive and negative power converters (226 and 236 of FIGS. 6 and 7, respectively), those skilled in the art will recognize that the invention functions in a manner that the inventor characterizes as a "flying inductor" power supply. Specifically, in accordance with the invention, an inductor is first connected to a low voltage circuit by means of a single switch (e.g., as shown in FIGS. 6 and 7) or switches that are connected to each terminal of the inductor. While the inductor remains connected to the low voltage circuit, current flowing through the inductor increases exponentially. When the current reaches an appropriate value, the switch or switches open, disconnecting the inductor from the low voltage circuit and the inductor is interconnected with a load circuit. By way of example, if the low voltage circuit causes 12 volts to be dropped across the inductor and the current through the inductor is 20 amperes at the time the inductor is switched to the load circuit, the input power at the time of switching is 240 watts. Assuming further that the impedance of the load circuit is 8 ohms, the instantaneous power delivered to the load is 3200 watts (the ampere inductor current flowing through the 8 ohm load). Thus, under this hypothetical example, a potential of 160 volts is developed across the resistive load at the time of switching. The practice of the invention involves two additional considerations. First, a capacitor is connected in parallel with the load circuit to store energy during the time period in which the inductor is connected to the load circuit. Energy stored in the capacitor supplies current to the load during the time period in which the inductor is switched back to the low voltage circuit. The second consideration is establishing component values and a switching rate (duty cycle) that meets the constraint imposed by the law of conservation of energy and provides the required output power. In the currently preferred embodiments of the invention, the output power requirements vary in accordance with the amplitude of the signal being amplified and, hence, the amplitude of the output signal being developed. In those embodiments, feedback from the load circuit is used in a manner that causes the output potential of the power supply to track the input signal, with the level of the output signal being sufficient to develop a desired output power.

The embodiments of the invention in which an exclusive property or privilege is claimed are defined as follows:

1. An audio amplifier operable to provide an amplified audio output signal, said audio amplifier being powered from a power source that exhibits a predetermined DC voltage, said audio amplifier comprising:

a power amplifier having an input terminal connected for receiving the audio input signal being amplified, an output terminal for supplying the amplified audio output signal to a loudspeaker, a positive power input terminal for supplying positive operating potential to said power amplifier, and a negative power input terminal for supplying a negative operating potential to said power amplifier;

a positive-going tracking-up converter for supplying positive operating potential to said positive power input terminal of said power amplifier with the magnitude of said positive operating potential exceeding positive portions of said amplified audio output signal by a predetermined first offset voltage, said positive-going tracking-up converter including a first pulse-width modulation means for supplying a pulse-width modulated signal representative of positive portions of the audio signal being amplified and a first switching means responsive to said pulse-width modulated signal for switching said positive-going tracking-up converter between first and second operational states, said positive-going tracking-up converter further including a first inductor and a first capacitor that are operatively connected to said first switching means so that current flow increases through said first inductor when said positive-going tracking-up converter is in said first operational state and the current flow through said first inductor is supplied to said first capacitor when said positive-going tracking-up converter is in said second operational state, the voltage developed across said first capacitor being supplied to said positive power input terminal of said power amplifier as said positive operating potential; and a negative-going tracking-up converter for supplying negative operating potential to said negative power input terminal of said power amplifier with the magnitude of said negative operating potential exceeding negative portions of said amplified audio output signal by a predetermined second offset voltage, said negative-going tracking-up converter including a second pulse-width modulation means for supplying a pulse-width modulated signal representative of negative portions of the audio signal being amplified and a second switching means responsive to said pulse-width modulated signal for switching said negative-going tracking-up converter between first and second operational states, said negative-going tracking-up converter further including a second inductor and a second capacitor that are operatively connected to said second switching means so that current flow increases through said second inductor when said negative-going tracking-up converter is in said first operational state and the current flow through said second inductor is supplied to said second capacitor when said negative-going tracking-up converter is in said second operational state, the voltage developed across said second capacitor being supplied to said negative power input terminal of said power amplifier as said negative operating potential.

2. The audio amplifier of claim 1, wherein said first switching means of said positive-going tracking-up converter and said second switching means of said negative-going tracking-up converter include first and second transistors, said first transistor being connected for receiving said pulse-width modulated signal supplied by said first pulse-width modulation means and for switching said positive-going tracking-up converter between said first and second operational states in substantial concurrence with the leading and trailing edges of each pulse of said pulse-width modulated signal supplied by said first pulse-width modulation means, said second transistor being connected for receiving said pulse-width modulated signal supplied by said second pulse-width modulation means and for switching said negative-going tracking-up converter between said first and second operational states in substantial concurrence with the leading and trailing edges of each pulse of said pulse-width modulation signal that is supplied by said second pulse-width modulation means.

3. The audio amplifier of claim 2, wherein said first and second transistors are first and second field effect transistors each having a source electrode, a drain electrode and a gate electrode, the drain electrode of said first field effect transistor being connected to one end of said first inductor, with the second end of said first inductor being connected to said predetermined DC voltage that supplies power to said audio amplifier, said gate electrode of said first field effect transistor being connected for receiving said pulse-width modulated signal supplied by said first pulse-width modulation means, said source electrode of said first field effect transistor being connected to ground potential, said gate electrode of said second field effect transistor being connected for receiving said pulse-width modulated signal supplied by said second pulse-width modulation means, said source electrode of said second field effect transistor being connected to a first end of said second inductor, with the second end of said second inductor being connected to ground potential, said source electrode of said second field effect transistor being connected to said second capacitor by means of a second diode, the drain electrode of said second field effect transistor being connected to said predetermined DC voltage that supplies power to said audio amplifier.

4. The audio input amplifier of claim 1, wherein said positive-going tracking-up converter includes means for limiting the duty cycle of said pulse-width modulated signal that is representative of positive portions of the audio signal being amplified to thereby establish the maximum magnitude of said positive operating potential supplied to said positive power input terminal of said power amplifier; and wherein said negative-going tracking-up converter includes means for limiting the duty cycle of said pulse-width modulated signal representative of negative portions of the audio signal being amplified so as to establish the maximum magnitude of said negative operating potential supplied to said negative power input terminal of said power amplifier.

5. The audio amplifier of claim 4, wherein said positive-going tracking-up converter further includes a first voltage limiter connected to said first pulse modulation means and connected for receiving said positive operating potential supplied by said first capacitor, said voltage limiter means supplying a first control signal to said first pulse-width modulation means in the event that the positive operating potential supplied by said first capacitor exceeds a predetermined level, said first control signal for reducing the duty cycle of said pulse-width modulated signal provided by said first pulse-width modulation means to thereby reduce the positive potential at said terminal of said first capacitor to a level that is below said predetermined level; and wherein said negative-going tracking-up converter further includes a second voltage limiter connected to said second pulse modulation means and connected for receiving said negative operating potential supplied by said second capacitor, said second voltage limiter supplying a control signal to said second pulse-width modulation means in the event that the negative potential supplied by said second capacitor exceeds a predetermined level, said second control signal for reducing the duty cycle of said pulse-width modulated signal provided by said second pulse-width modulation means to thereby reduce the negative potential at said terminal of said second capacitor to a level that is below said predetermined level.

6. The audio amplifier of claim 5, wherein:
(a) said audio amplifier includes a positive power input terminal and a ground terminal for receiving a predetermined DC voltage operating power supplied by said power source;
(b) a first terminal of said first inductor is connected to said positive power input terminal and a second terminal of said first inductor connected to said first switching means;
(c) said first switching means is operable to establish a current path between said second terminal of said inductor and said ground terminal when said positive-going tracking-up converter is in said first operational state and to establish a current path between said second terminal of said first inductor and said first capacitor when said positive-going tracking-up converter is in said second operational state;

(d) a first terminal of said second inductor is connected to said ground terminal and a second terminal of said second inductor is connected to said second switching means;

(e) said second switching means is operable to establish a current path between said second terminal of said second inductor and said positive power input terminal when said negative-going tracking-up converter is in said first operational state to increase current flow through said second inductor and interrupting said current path between said second terminal of said second inductor and said positive power input terminal when said negative-going tracking-up converter is in said second operational state.

7. The audio amplifier of claim 6, wherein said first switching means of said positive-going tracking-up converter includes at least one transistor connected for receiving said pulse-width modulated signal supplied by said first pulse-width modulation means and for switching said positive-going tracking-up converter between said first and second operational states in substantial concurrence with the leading and trailing edges of each pulse of said pulse-width modulated signal supplied by said first pulse-width modulation means;

said second switching means of said negative-going tracking-up converter including at least one transistor connected for receiving a signal representative of said pulse-width modulated signal supplied by said second pulse-width modulation means and for switching said negative-going tracking-up converter between said first and second operational states in substantial concurrence with the leading and trailing edges of each pulse of said pulse-width modulation signal that is supplied by said second pulse-width modulation means;

said negative-going tracking-up converter further including a level shifter and a current source for providing operating potentials referenced to said second terminal of said second inductor, said level shifter connected for receiving said pulse-width modulated signal supplied by said second pulse-width modulation means, said level shifter providing said output signal representative of said pulse-width modulated signal supplied by said second pulse-width modulation means; said level shifter further including a bias network connected between said current source and said second terminal of said second inductor, said current source supplying current to said bias network to establish said operating potentials referenced to said second terminal of said second inductor.

8. The audio amplifier of claim 7 wherein each transistor of said at least one transistor of said positive-going tracking-up converter is a field effect transistor having a source electrode, drain electrode and a gate electrode, said drain electrode of each said field effect transistor being connected to said second terminal of said first inductor, said gate electrode of each of said field effect transistors being connected for receiving said pulse-width modulated signal supplied by said first pulse-width modulation means, said source electrode of each of said field effect transistors being connected to said ground potential; and wherein each said transistor of said at least one second transistor of said negative-going tracking-up converter is a field effect transistor having a source electrode, drain electrode and a gate electrode, said gate electrode of each said second field effect transistor being connected for receiving said signal representative of said pulse-width modulated signal supplied by said level shifter, said source electrode of each said second field effect transistor being connected to said second terminal of said second inductor, said drain electrode of each said second field effect transistor being connected to said positive power input terminal.

9. The audio amplifier of claim 1 further comprising a steering network connected for receiving the audio signal being amplified by said audio amplifier, said steering network including means for supplying a signal representative of the positive portions of said audio signal to be amplified and means for supplying a signal representative of the negative portions of said audio signal to be amplified, said signal representative of said positive portions of said signal to be amplified being supplied to said first pulse-width modulation means of said positive-going tracking-up converter and said signal representative of said negative portions of said audio signal being amplified being coupled to said second pulse-width modulation means of said negative-going tracking-up converter.

10. The audio amplifier of claim 9, wherein said first switching means of said positive-going tracking-up converter and said second switching means of said negative-going tracking-up converter include first and second transistors, said first transistor being connected for receiving said pulse-width modulated signal supplied by said first pulse-width modulation means and for switching said positive-going tracking-up converter between said first and second operational states in substantial concurrence with the leading and trailing edges of each pulse of said pulse-width modulated signal supplied by said first pulse-width modulation means, said second transistor being connected for receiving said pulse-width modulated signal supplied by said second pulse-width modulation means and for switching said negative-going tracking-up converter between said first and second operational states in substantial concurrence with the leading and trailing edges of each pulse of said pulse-width modulation signal that is supplied by said second pulse-width modulation means.

11. The audio amplifier of claim 10, wherein said first and second transistors are first and second field effect transistors each having a source electrode, a drain electrode and a gate electrode, the drain electrode of said first field effect transistor being connected to one end of said first inductor, with the second end of said first inductor being connected to said predetermined DC voltage that supplies power to said audio amplifier, said gate electrode of said first field effect transistor being connected for receiving said pulse-width modulated signal supplied by said first pulse-width modulation means, said source electrode of said first field effect transistor being connected to ground potential, said gate electrode of said second field effect transistor being connected for receiving said pulse-width modulated signal supplied by said second pulse-width modulation means, said source electrode of said second field effect transistor being connected to a first end of said second inductor, with the second end of said second inductor being connected to ground potential, said source electrode of said second field effect transistor being connected to said second capacitor by means of a second diode, the drain electrode of said second field effect transistor being connected to said predetermined DC voltage that supplies power to said audio amplifier.

12. The audio amplifier of claim 9 further comprising first and second input amplifier stages, said first input amplifier stage being connected for receiving said signal supplied by said steering network that is representative of the positive portions of said signal being amplified and being connected for supplying an amplified output signal that is representative of said positive portions of said signal being amplified to said first pulse-width modulation means; said second input amplifier being connected for receiving said signal supplied by said steering means that is representative of negative portions of said audio signal being amplified and being connected for supplying an amplified output signal that is representative of said negative portions of said signal being amplified to said second modulation means.

13. The audio amplifier of claim 12 wherein said positive-going tracking-up converter further includes linearity control means connected to the output of said first input amplifier for compensating for non-linearities in the relationship between the amplitude of said signal supplied to said first input amplifier by said steering network and the duration of the pulses supplied by said first pulse-width modulation means and wherein said negative-going tracking-up converter further includes linearity control means connected to the output of said first input amplifier for compensating for non-linearities in the relationship between the amplitude of said signal supplied to said first input amplifier by said steering network and the duration of the pulses supplied by said first pulse-width modulation means.

14. The audio amplifier of claim 1 wherein said first modulation means includes means for supplying said pulse-width modulated signal as a constant frequency pulse modulated signal in which the time duration of each pulse represents the amplitude of the positive-going portion of said signal being amplified at substantially the same time as the pulse is supplied by said first pulse-width modulation means; and said second pulse-width modulation means includes means for supplying said pulse-width modulated signal at a constant frequency that is equal to the constant frequency of said first pulse-width modulation means with the width of each pulse supplied by said second modulation means being representative of the magnitude of the negative portion of the signal being amplified at substantially the same time as the pulses generated by said second modulation means.

15. The audio amplifier of claim 14 further comprising a steering network connected for receiving the audio signal being amplified by said audio amplifier, said steering network including means for supplying a signal representative of the positive portions of said audio signal to be amplified and means for supplying a signal representative of the negative portions of said audio signal to be amplified, said signal representative of said positive portions of said signal to be amplified being supplied to said first pulse-width modulation means of said positive-going tracking-up converter and said signal representative of said negative portions of said audio signal being amplified being coupled to said second pulse-width modulation means of said negative-going tracking-up converter.

16. The audio amplifier of claim 15, wherein said first switching means of said positive-going tracking-up converter and said second switching means of said negative-going tracking-up converter include first and second transistors, said first transistor being connected for receiving said pulse-width modulated signal supplied by said first pulse-width modulation means and for switching said positive-going tracking-up converter between said first and second operational states in substantial concurrence with the leading and trailing edges of each pulse of said pulse-width modulated signal supplied by said first pulse-width modulation means, said second transistor being connected for receiving said pulse-width modulated signal supplied by said second pulse-width modulation means and for switching said negative-going tracking-up converter between said first and second operational states in substantial concurrence with the leading and trailing edges of each pulse of said pulse-width modulation signal that is supplied by said second pulse-width modulation means.

17. The audio amplifier of claim 16, wherein said first and second transistors are first and second field effect transistors each having a source electrode, a drain electrode and a gate electrode, the drain electrode of said first field effect transistor being connected to one end of said first inductor, with the second end of said first inductor being connected to said predetermined DC voltage that supplies power to said audio amplifier, said gate electrode of said first field effect transistor being connected for receiving said pulse-width modulated signal supplied by said first pulse-width modulation means, said source electrode of said first field effect transistor being connected to ground potential, said gate electrode of said second field effect transistor being connected for receiving said pulse-width modulated signal supplied by said second pulse-width modulation means, said source electrode of said second field effect transistor being connected to a first end of said second inductor, with the second end of said second inductor being connected to ground potential, said source electrode of said second field effect transistor being connected to said second capacitor by means of a second diode, the drain electrode of said second field effect transistor being connected to said predetermined DC voltage that supplies power to said audio amplifier.

18. The audio amplifier of claim 17 further comprising first and second input amplifier stages, said first input amplifier stage being connected for receiving said signal supplied by said steering network that is representative of the positive portions of said signal being amplified and being connected for supplying an amplified output signal that is representative of said positive portions of said signal being amplified to said first pulse-width modulation means; said second input amplifier being connected for receiving said signal supplied by said steering means that is representative of negative portions of said audio signal being amplified and being connected for supplying an amplified output signal that is representative of said negative portions of said signal being amplified to said second modulation means.

19. The audio amplifier of claim 18 wherein said positive-going tracking-up converter further includes linearity control means connected to the output of said first input amplifier for compensating for non-linearities in the relationship between the amplitude of said signal supplied to said first input amplifier by said steering network and the duration of the pulses supplied by said first pulse-width modulation means and wherein said negative-going tracking-up converter further includes linearity control means connected to the output of said first input amplifier for compensating for non-linearities in the relationship between the amplitude of said signal supplied to said first input amplifier by said steering network and the duration of the pulses supplied by said first pulse-width modulation means.

20. The audio amplifier of claim 1 wherein said positive-going tracking-up converter further includes a first voltage limiter connected to said first pulse modulation means and connected for receiving said positive operating potential supplied by said first capacitor, said voltage limiter means supplying a first control signal to said first pulse-width modulation means in the event that the positive operating potential supplied by said first capacitor exceeds a predetermined level, said first control signal for reducing the duty cycle of said pulse-width modulated signal provided by said first pulse-width modulation means to thereby reduce the positive potential at said terminal of said first capacitor to a level that is below said predetermined level; and wherein said negative-going tracking-up converter further includes a second voltage limiter connected to said second pulse modulation means and connected for receiving said negative operating potential supplied by said second capacitor, said second voltage limiter supplying a control signal to said second pulse-width modulation means in the event that the negative potential supplied by said second capacitor exceeds a predetermined level, said second control signal for reducing the duty cycle of said pulse-width modulated signal provided by said second pulse-width modulation means to thereby reduce the negative potential at said terminal of said second capacitor to a level that is below said predetermined level.

21. The audio input amplifier of claim 20, wherein said positive-going tracking-up converter includes means for limiting the duty cycle of said pulse-width modulated signal that is representative of positive portions of the audio signal being amplified to thereby establish the maximum magnitude of said positive operating potential supplied to said positive power input terminal of said power amplifier; and wherein said negative-going tracking-up converter includes means for limiting the duty cycle of said pulse-width modulated signal representative of negative portions of the audio signal being amplified so as to establish the maximum magnitude of said negative operating potential supplied to said negative power input terminal of said power amplifier.

22. The audio amplifier of claim 21 further comprising a steering network connected for receiving the audio signal being amplified by said audio amplifier, said steering network including means for supplying a signal representative of the positive portions of said audio signal to be amplified and means for supplying a signal representative of the negative portions of said audio signal to be amplified, said signal representative of said positive portions of said signal to be amplified being supplied to said first pulse-width modulation means of said positive-going tracking-up converter and said signal representative of said negative portions of said audio signal being amplified being coupled to said second pulse-width modulation means of said negative-going tracking-up converter.

23. The audio amplifier of claim 22 further comprising first and second input amplifier stages, said first input amplifier stage being connected for receiving said signal supplied by said steering network that is representative of the positive portions of said signal being amplified and being connected for supplying an amplified output signal that is representative of said positive portions of said signal being amplified to said first pulse-width modulation means; said second input amplifier being connected for receiving said signal supplied by said steering means that is representative of negative portions of said audio signal being amplified and being connected for supplying an amplified output signal that is representative of said negative portions of said signal being amplified to said second modulation means.

24. The audio amplifier of claim 23 wherein said positive-going tracking-up converter further includes linearity control means connected to the output of said first input amplifier for compensating for non-linearities in the relationship between the amplitude of said signal supplied to said first input amplifier by said steering network and the duration of the pulses supplied by said first pulse-width modulation means and wherein said negative-going tracking-up converter further includes linearity control means connected to the output of said first input amplifier for compensating for non-linearities in the relationship between the amplitude of said signal supplied to said first input amplifier by said steering network and the duration of the pulses supplied by said first pulse-width modulation means.

25. The audio amplifier of claim 24 further comprising an on/off control circuit for switching said audio amplifier between an on state and an off state, said on/off control circuit connected to said first pulse-width modulation means of said positive-going tracking-up converter and connected to said second pulse-width modulation means of said negative-going tracking-up converter, said on/off control circuit providing a signal to disable said first and second pulse-width modulators when said audio amplifier is in said off state.

26. The audio amplifier of claim 1 further comprising first and second input amplifier stages, said first input amplifier stage being connected for receiving said signal supplied by said steering network that is representative of the positive portions of said signal being amplified and being connected for supplying an amplified output signal that is representative of said positive portions of said signal being amplified to said first pulse-width modulation means; said second input amplifier being connected for receiving said signal supplied by said steering means that is representative of negative portions of said audio signal being amplified and being connected for supplying an amplified output signal that is representative of said negative portions of said signal being amplified to said second modulation means.

27. The audio amplifier of claim 26 wherein said first modulation means includes means for supplying said pulse-width modulated signal as a constant frequency pulse modulated signal in which the time duration of each pulse represents the amplitude of the positive-going portion of said signal being amplified at substantially the same time as the pulse is supplied by said first pulse-width modulation means; and said second pulse-width modulation means includes means for supplying said pulse-width modulated signal at a constant frequency that is equal to the constant frequency of said first pulse-width modulation means with the width of each pulse supplied by said second modulation means being representative of the magnitude of the negative portion of the signal being amplified at substantially the same time as the pulses generated by said second modulation means.

28. The audio amplifier of claim 27 further comprising a steering network connected for receiving the audio signal being amplified by said audio amplifier, said steering network including means for supplying a signal representative of the positive portions of said audio signal to be amplified and means for supplying a signal representative of the negative portions of said audio signal to be amplified, said signal representative of said positive portions of said signal to be amplified being supplied to said first pulse-width modulation means of said positive-going tracking-up converter and said signal representative of said negative portions of said audio signal being amplified being coupled to said second pulse-width modulation means of said negative-going tracking-up converter.

29. The audio amplifier of claim 28 further comprising an on/off control circuit for switching said audio amplifier between an on state and an off state, said on/off control circuit connected to said first pulse-width modulation means of said positive-going tracking-up converter and connected to said second pulse-width modulation means of said negative-going tracking-up converter, said on/off control circuit providing a signal to disable said first and second pulse-width modulators when said audio amplifier is in said off state.

30. The audio amplifier of claim 29, wherein said first switching means of said positive-going tracking-up converter and said second switching means of said negative-going tracking-up converter include first and second transistors, said first transistor being connected for receiving said pulse-width modulated signal supplied by said first pulse-width modulation means and for switching said positive-going tracking-up converter between said first and second operational states in substantial concurrence with the leading and trailing edges of each pulse of said pulse-width modulated signal supplied by said first pulse-width modulation means, said second transistor being connected for receiving said pulse-width modulated signal supplied by said second pulse-width modulation means and for switching said negative-going tracking-up converter between said first and second operational states in substantial concurrence with the leading and trailing edges of each pulse of said pulse-width modulation signal that is supplied by said second pulse-width modulation means.

31. The audio amplifier of claim 29, wherein said first and second transistors are first and second field effect transistors each having a source electrode, a drain electrode and a gate electrode, the drain electrode of said first field effect transistor being connected to one end of said first inductor, with the second end of said first inductor being connected to said predetermined DC voltage that supplies power to said audio amplifier, said gate electrode of said first field effect transistor being connected for receiving said pulse-width modulated signal supplied by said first pulse-width modulation means, said source electrode of said first field effect transistor being connected to ground potential, said gate electrode of said second field effect transistor being connected for receiving said pulse-width modulated signal supplied by said second pulse-width modulation means, said source electrode of said second field effect transistor being connected to a first end of said second inductor, with the second end of said second inductor being connected to ground potential, said source electrode of said second field effect transistor being connected to said second capacitor by means of a second diode, the drain electrode of said second field effect transistor being connected to said predetermined DC voltage that supplies power to said audio amplifier.

32. The audio amplifier of claim 1, wherein: (a) said audio amplifier includes a positive power input terminal and a ground terminal for receiving a predetermined DC voltage operating power supplied by said power source;
  (b) a first terminal of said first inductor is connected to said positive power input terminal and a second terminal of said first inductor connected to said first switching means;
  (c) said first switching means is operable to establish a current path between said second terminal of said inductor and said ground terminal when said positive-going tracking-up converter is in said first operational state and to establish a current path between said second terminal of said first inductor and said first capacitor when said positive-going tracking-up converter is in said second operational state;
  (d) a first terminal of said second inductor is connected to said ground terminal and a second terminal of said second inductor is connected to said second switching means;
  (e) said second switching means is operable to establish a current path between said second terminal of said second inductor and said positive power input terminal when said negative-going tracking-up converter is in said first operational state to increase current flow through said second inductor and interrupting said current path between said second terminal of said second inductor and said positive power input terminal when said negative-going tracking-up converter is in said second operational state.

33. The audio amplifier of claim 32, wherein said first switching means of said positive-going tracking-up converter includes at least one transistor connected for receiving said pulse-width modulated signal supplied by said first pulse-width modulation means and for switching said positive-going tracking-up converter between said first and second operational states in substantial concurrence with the leading and trailing edges of each pulse of said pulse-width modulated signal supplied by said first pulse-width modulation means;
  said second switching means of said negative-going tracking-up converter including at least one transistor connected for receiving a signal representative of said pulse-width modulated signal supplied by said second pulse-width modulation means and for switching said negative-going tracking-up converter between said first and second operational states in substantial concurrence with the leading and trailing edges of each pulse of said pulse-width modulation signal that is supplied by said second pulse-width modulation means;
  said negative-going tracking-up converter further including a level shifter and a current source for providing operating potentials referenced to said second terminal of said second inductor, said level shifter connected for receiving said pulse-width modulated signal supplied by said second pulse-width modulation means, said level shifter providing said output signal representative of said pulse-width modulated signal supplied by said second pulse-width modulation means; said level shifter further including a bias network connected between said current source and said second terminal of said second inductor, said current source supplying current to said bias network to establish said operating potentials referenced to said second terminal of said second inductor.

34. The audio amplifier of claim 33 wherein each transistor of said at least one transistor of said positive-going tracking-up converter is a field effect transistor having a source electrode, drain electrode and a gate electrode, said drain electrode of each said field effect transistor being connected to said second terminal of said first inductor, said gate electrode of each of said field effect transistors being connected for receiving said pulse-width modulated signal supplied by said first pulse-width modulation means, said source electrode of each of said field effect transistors being connected to said ground potential; and wherein each said transistor of said at least one second transistor of said negative-going tracking-up converter is a field effect transistor having a source electrode, drain electrode and a gate electrode, said gate electrode of each said second field effect transistor being connected for receiving said signal representative of said pulse-width modulated signal supplied by said level shifter, said source electrode of each said second field effect transistor being connected to said second terminal of said second inductor, said drain electrode of each said second field effect transistor being connected to said positive power input terminal.

35. The audio amplifier of claim 32, wherein said positive-going tracking-up converter further includes a first voltage limiter connected to said first pulse modulation means and connected for receiving said positive operating potential supplied by said first capacitor, said voltage limiter means supplying a first control signal to said first pulse-width modulation means in the event that the positive operating potential supplied by said first capacitor exceeds a predetermined level, said first control signal for reducing the duty cycle of said pulse-width modulated signal provided by said first pulse-width modulation means to thereby reduce the positive potential at said terminal of said first capacitor to a level that is below said predetermined level; and wherein said negative-going tracking-up converter further includes a second voltage limiter connected to said second pulse modulation means and connected for receiving said negative operating potential supplied by said second capacitor, said second voltage limiter supplying a control signal to said second pulse-width modulation means in the event that the negative potential supplied by said second capacitor exceeds a predetermined level, said second control signal for reducing the duty cycle of said pulse-width modulated signal provided by said second pulse-width modulation means to thereby reduce the negative potential at said terminal of said second capacitor to a level that is below said predetermined level.

36. The audio input amplifier of claim 32, wherein said positive-going tracking-up converter includes means for limiting the duty cycle of said pulse-width modulated signal that is representative of positive portions of the audio signal being amplified to thereby establish the maximum magnitude of said positive operating potential supplied to said positive power input terminal of said power amplifier; and wherein said negative-going tracking-up converter includes means for limiting the duty cycle of said pulse-width modulated signal representative of negative portions of the audio signal being amplified so as to establish the maximum magnitude of said negative operating potential supplied to said negative power input terminal of said power amplifier.

* * * * *